(12) United States Patent
Cho et al.

(10) Patent No.: US 11,376,888 B2
(45) Date of Patent: *Jul. 5, 2022

(54) DECORATIVE MEMBER AND METHOD FOR MANUFACTURING DECORATIVE MEMBER

(71) Applicant: LG CHEM, LTD., Seoul (KR)

(72) Inventors: Eun Byurl Cho, Daejeon (KR); Yong Chan Kim, Daejeon (KR); Jeong Woo Shon, Daejeon (KR); Pilsung Jo, Daejeon (KR); Nansra Heo, Daejeon (KR); Jin Suk Song, Daejeon (KR); Sangcholl Han, Daejeon (KR); Song Ho Jang, Daejeon (KR); Ki Hwan Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 66 days.

This patent is subject to a terminal disclaimer.

(21) Appl. No.: 16/465,106

(22) PCT Filed: Mar. 6, 2018

(86) PCT No.: PCT/KR2018/002671
§ 371 (c)(1),
(2) Date: May 29, 2019

(87) PCT Pub. No.: WO2018/164463
PCT Pub. Date: Sep. 13, 2018

(65) Prior Publication Data
US 2019/0381761 A1   Dec. 19, 2019

(30) Foreign Application Priority Data

Mar. 6, 2017  (KR) .................. 10-2017-0028261
Oct. 20, 2017  (KR) .................. 10-2017-0136790
Nov. 28, 2017  (KR) .................. 10-2017-0160298

(51) Int. Cl.
*B44F 1/10*     (2006.01)
*C23C 14/20*    (2006.01)
(Continued)

(52) U.S. Cl.
CPC .................. *B44F 1/10* (2013.01); *B32B 3/26* (2013.01); *B32B 7/023* (2019.01); *B32B 27/16* (2013.01);
(Continued)

(58) Field of Classification Search
CPC ......... B32B 27/00; B32B 27/16; B32B 27/20; B32B 2451/00; B32B 3/30; B32B 3/26; B32B 33/00; B32B 7/023
See application file for complete search history.

(56) References Cited

U.S. PATENT DOCUMENTS 3,365,350 A   1/1968  Cahn
7,187,487 B2  3/2007  Przybyla et al.
(Continued)

FOREIGN PATENT DOCUMENTS

CN    2056903 U      5/1990
CN    101666886 A    3/2010
(Continued)

OTHER PUBLICATIONS

Mokrzycki, et al. 2012.Color Difference Delta E-A Survey. Machine Graphic & Vision.

*Primary Examiner* — Michael Zhang
(74) *Attorney, Agent, or Firm* — Dentons US LLP

(57) ABSTRACT

The present disclosed relates to a decoration element and a method for preparing the decoration element. decoration element has dichroism expressing different colors depending on a viewing direction, and has improved visibility of the dichroism.

18 Claims, 54 Drawing Sheets

(51) Int. Cl.
    *C23C 14/24*     (2006.01)
    *C23C 14/34*     (2006.01)
    *B32B 7/023*     (2019.01)
    *B32B 3/26*     (2006.01)
    *B32B 27/16*     (2006.01)
    *B32B 27/20*     (2006.01)
    *B32B 33/00*     (2006.01)
    *G02B 5/22*     (2006.01)
    *B32B 15/04*     (2006.01)
    *B32B 27/00*     (2006.01)

(52) U.S. Cl.
    CPC .............. *B32B 27/20* (2013.01); *B32B 33/00* (2013.01); *C23C 14/205* (2013.01); *C23C 14/24* (2013.01); *C23C 14/34* (2013.01); *B32B 15/04* (2013.01); *B32B 27/00* (2013.01); *B32B 2255/20* (2013.01); *B32B 2311/04* (2013.01); *B32B 2311/16* (2013.01); *B32B 2311/18* (2013.01); *B32B 2311/24* (2013.01); *B32B 2311/30* (2013.01); *B32B 2313/04* (2013.01); *B32B 2451/00* (2013.01); *G02B 5/22* (2013.01)

(56) References Cited

U.S. PATENT DOCUMENTS

| | | |
|---|---|---|
| 7,719,767 B2 | 5/2010 | Lin et al. |
| 7,923,122 B2 | 4/2011 | Korechika et al. |
| 2003/0184866 A1 | 10/2003 | Mimura et al. |
| 2005/0024754 A1* | 2/2005 | Epstein .................... G02B 5/09 |
| | | 359/831 |
| 2005/0141094 A1 | 6/2005 | Wild et al. |
| 2008/0206495 A1* | 8/2008 | Korechika ............... G02B 5/09 |
| | | 428/30 |
| 2010/0060987 A1 | 3/2010 | Witzman et al. |
| 2012/0064303 A1 | 3/2012 | Yashiki et al. |
| 2012/0068450 A1 | 3/2012 | MacPherson et al. |
| 2013/0048072 A1 | 2/2013 | Choi |
| 2014/0104690 A1 | 4/2014 | Sandre-Chardonnal |
| 2015/0258838 A1* | 9/2015 | Fuhse ................... B42D 25/328 |
| | | 283/85 |
| 2016/0052227 A1 | 2/2016 | Takihara et al. |

FOREIGN PATENT DOCUMENTS

| | | |
|---|---|---|
| CN | 102460236 A | 5/2012 |
| CN | 102971862 A | 3/2013 |
| CN | 105102211 A | 11/2015 |
| JP | 10-71668 A | 3/1998 |
| JP | 11-300920 A | 11/1999 |
| JP | 2001-264525 A | 9/2001 |
| JP | 2002-108221 A | 4/2002 |
| JP | 2006-504545 A | 2/2006 |
| JP | 2008-083599 A | 4/2008 |
| JP | 2009-80205 A | 4/2009 |
| JP | 2009-168928 A | 7/2009 |
| JP | 2009-291966 A | 12/2009 |
| JP | 2010-197798 A | 9/2010 |
| JP | 2011-140136 A | 7/2011 |
| JP | 2011-173379 A | 9/2011 |
| JP | 5493203 B2 | 5/2014 |
| KR | 10-2008-0078523 A | 8/2008 |
| KR | 10-0953696 B1 | 4/2010 |
| KR | 10-2013-0077567 A | 7/2013 |
| KR | 10-1452140 B1 | 10/2014 |
| KR | 10-1629887 B1 | 6/2016 |
| KR | 10-2016-0080748 A | 7/2016 |
| KR | 10-1764104 B1 | 7/2017 |
| WO | 2001003945 A1 | 1/2001 |

* cited by examiner

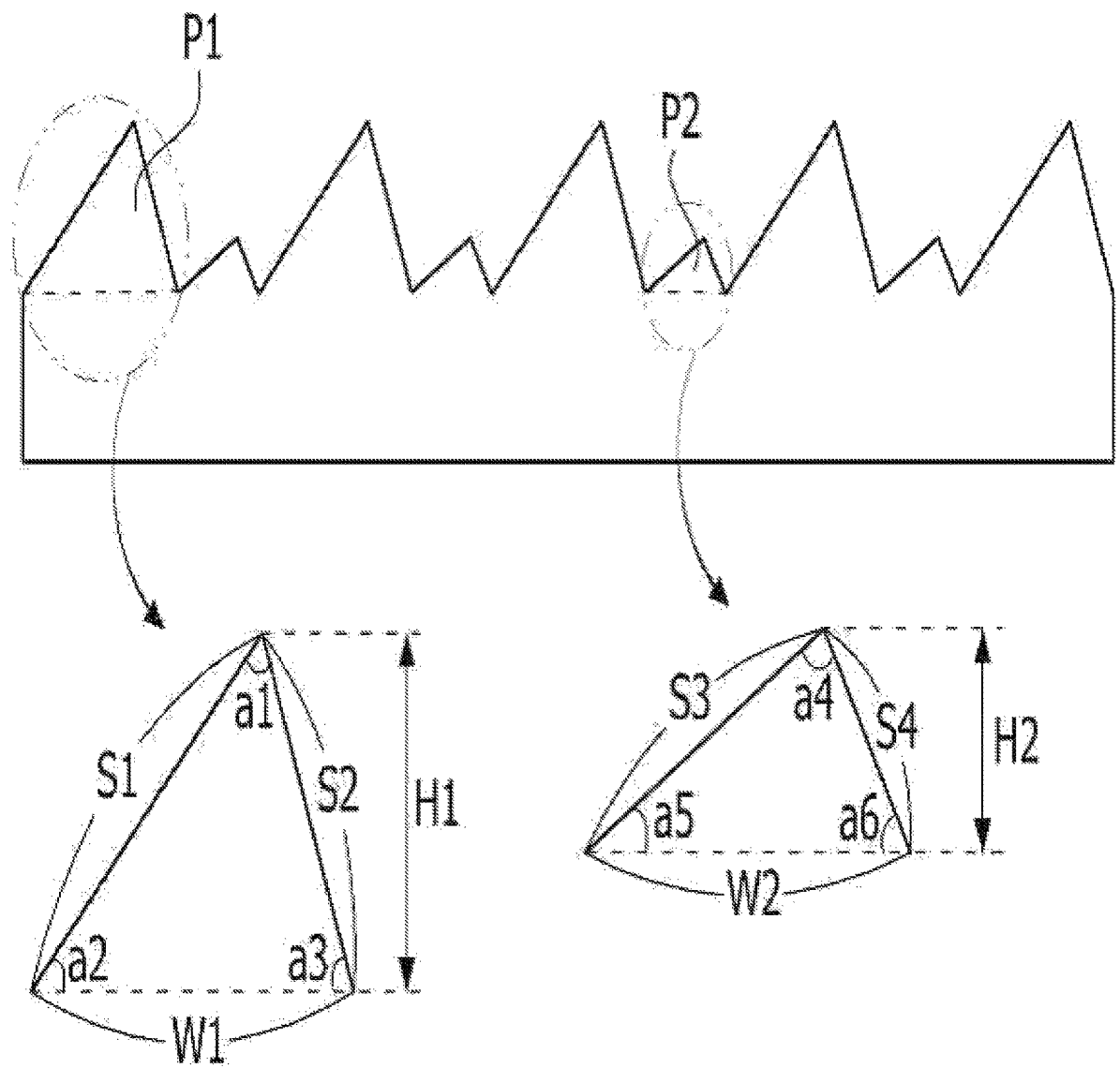
[FIG. 1]

[FIG. 2]
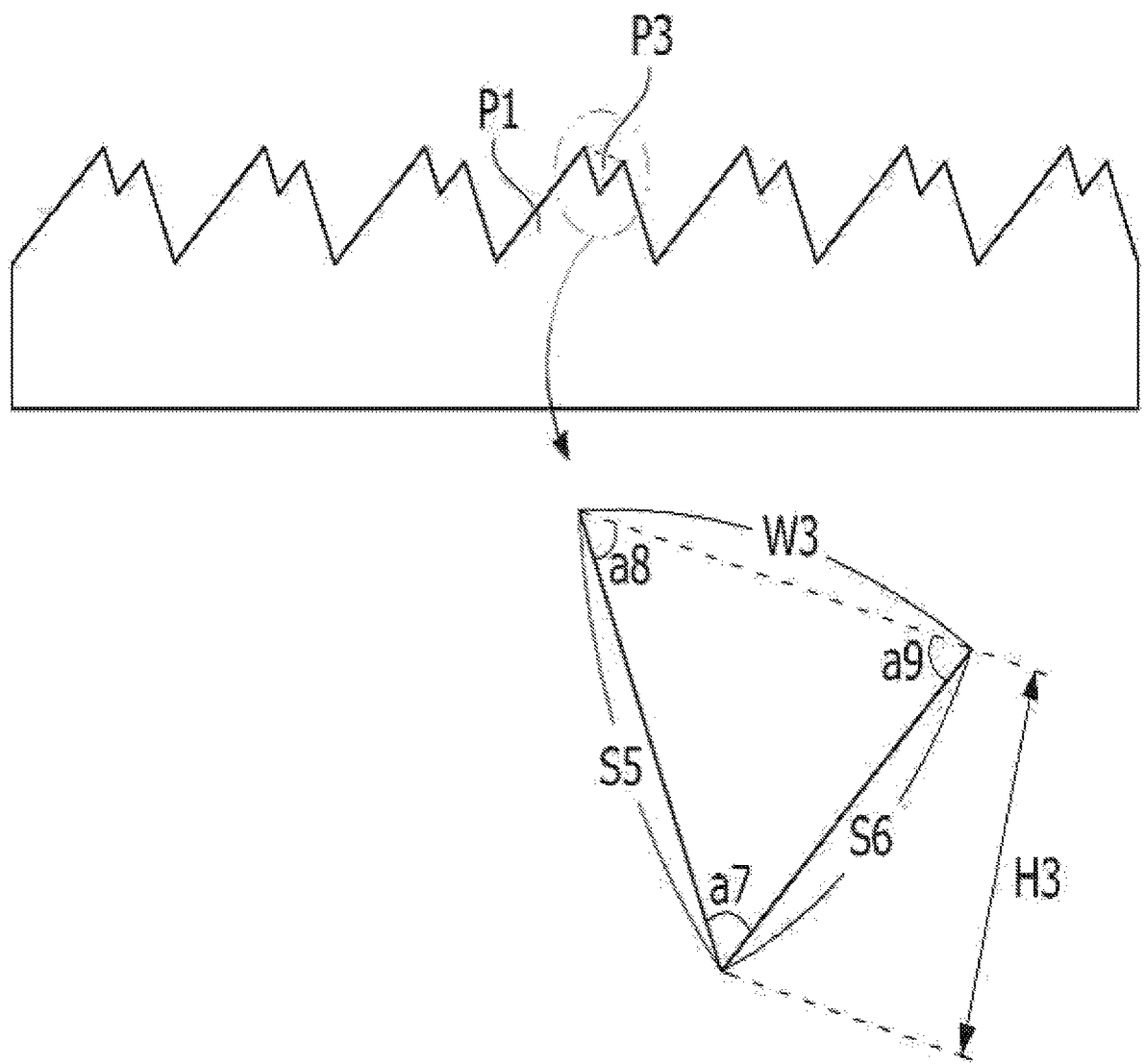

[FIG. 3]
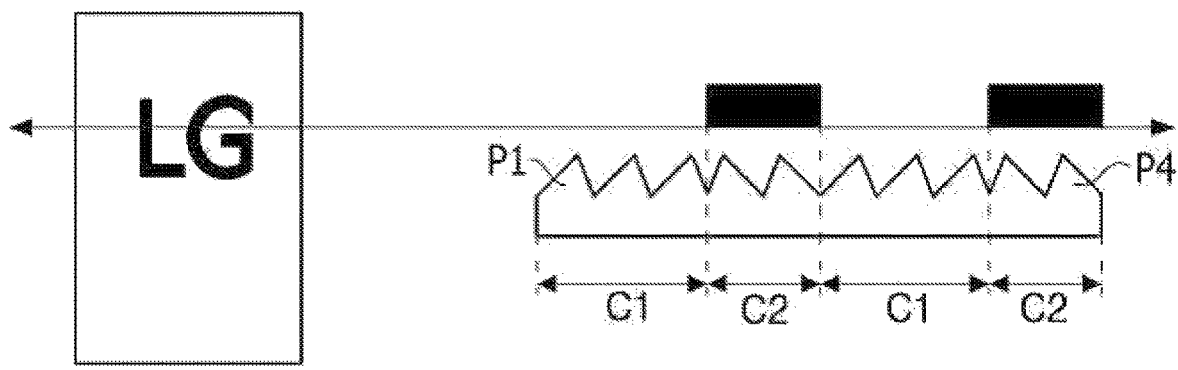
Cross-Secional view
(a)
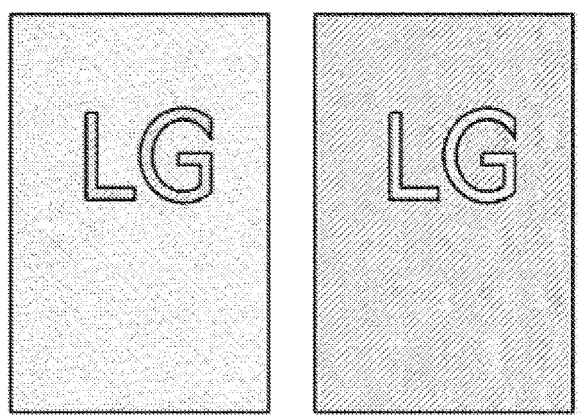
Left-side view    Right-side view
(b)

[FIG. 4]
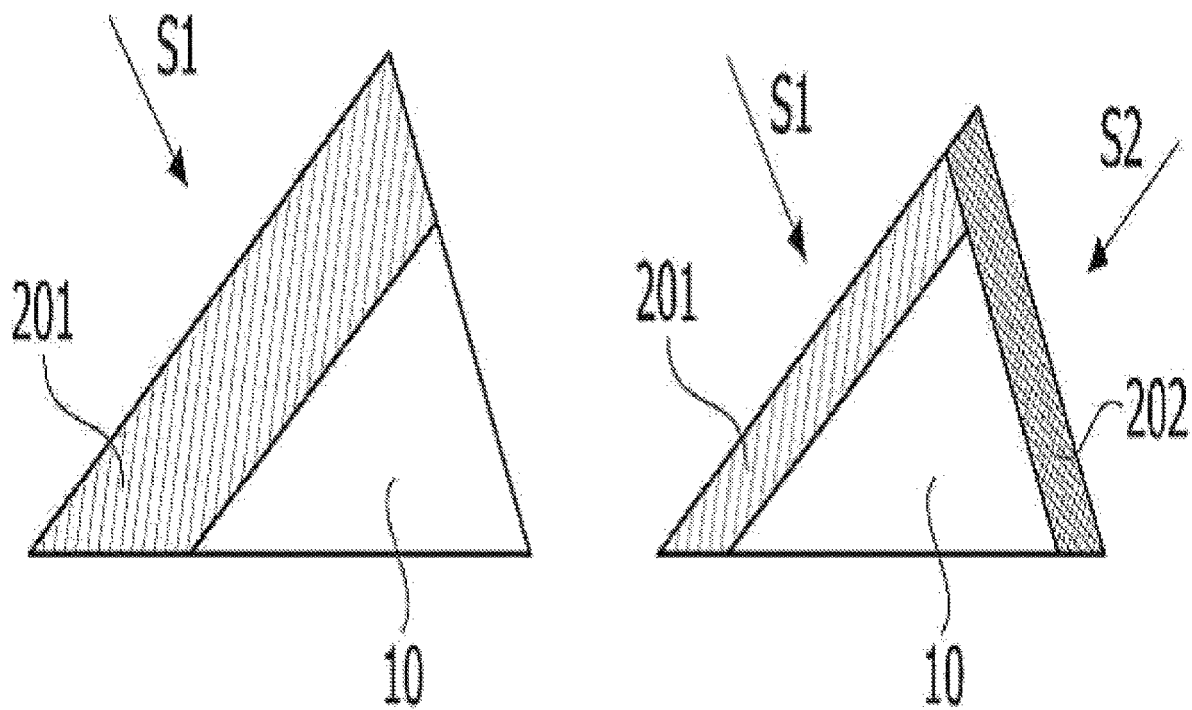

[FIG. 5]
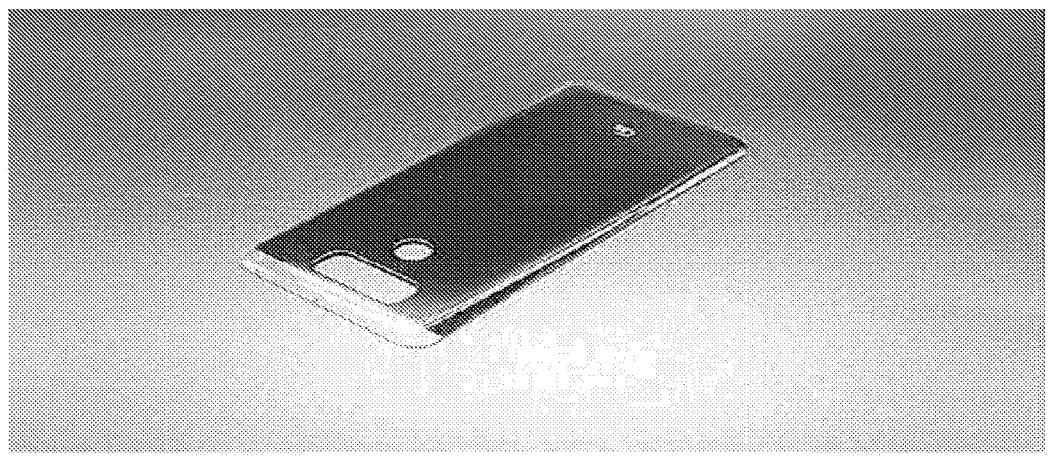
(a)
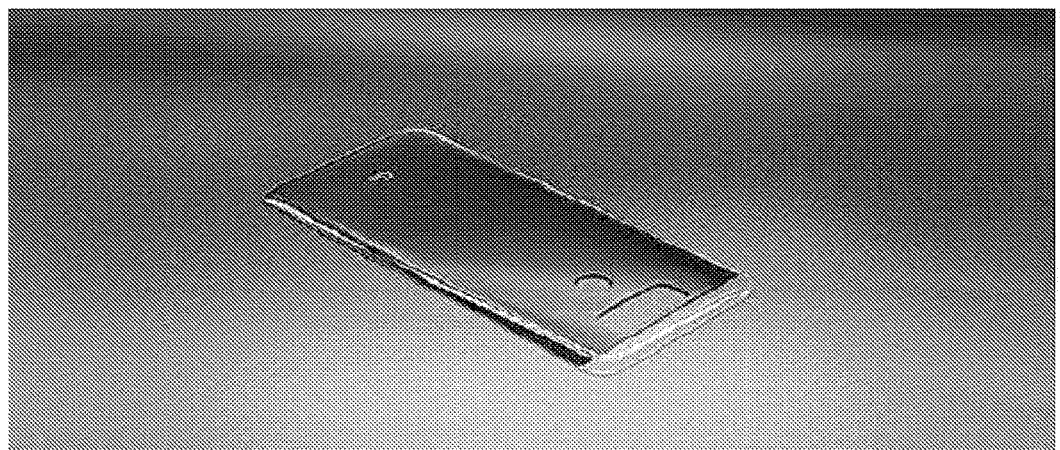
(b)

[FIG. 6]
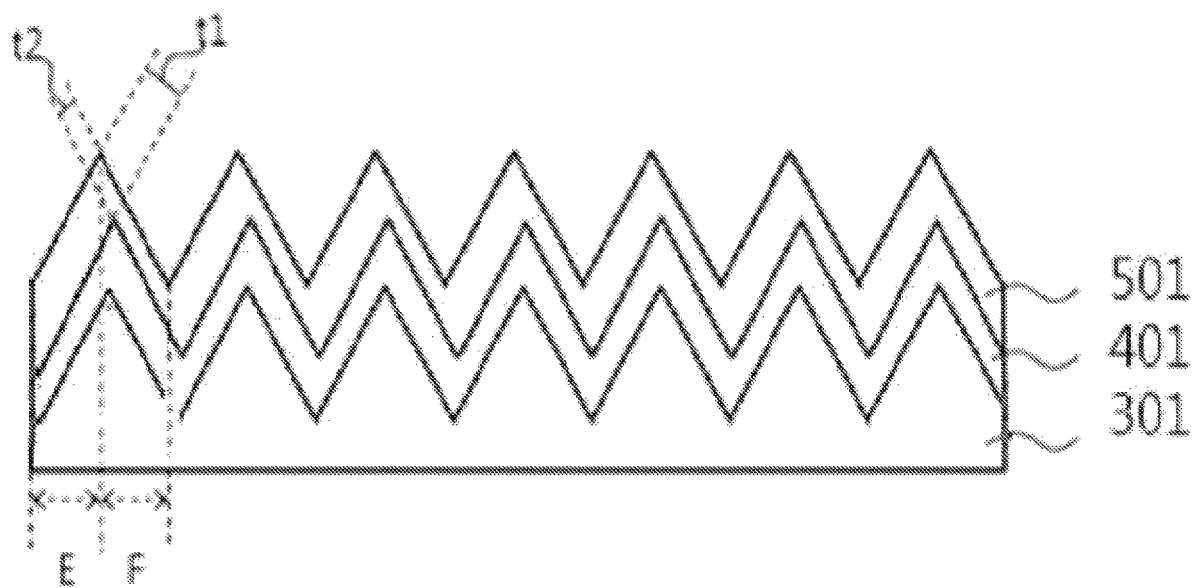

[FIG. 7]
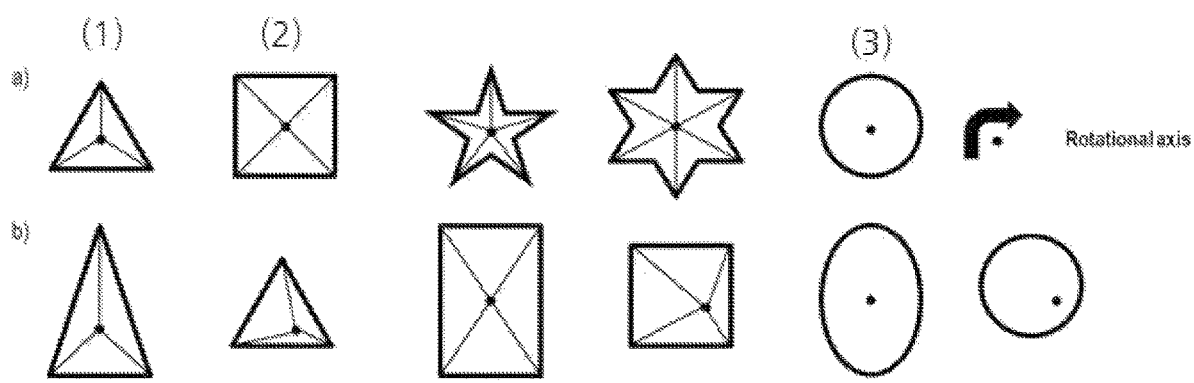
(1) Equilateral Triangle Pyramid
(2) Square Pyramid
(3) Circular Cone

[FIG. 8]
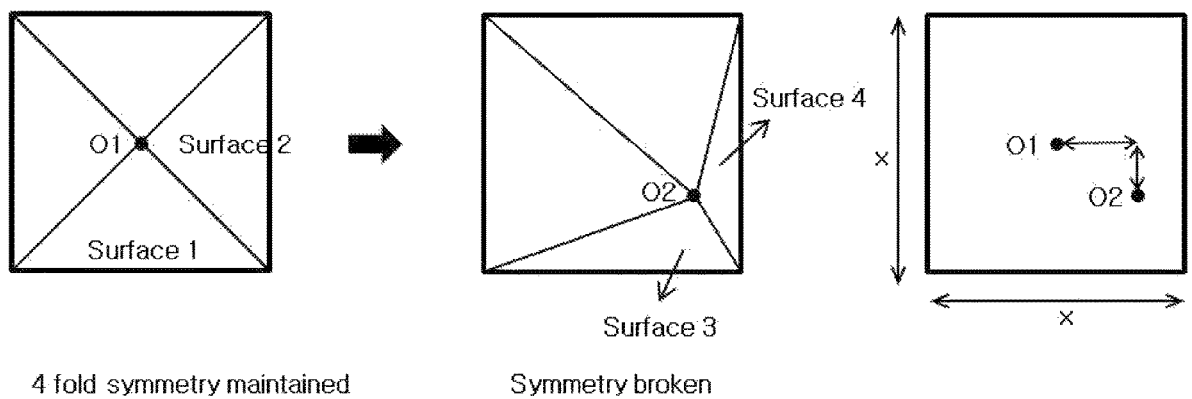
4 fold symmetry maintained     Symmetry broken

[FIG. 9]
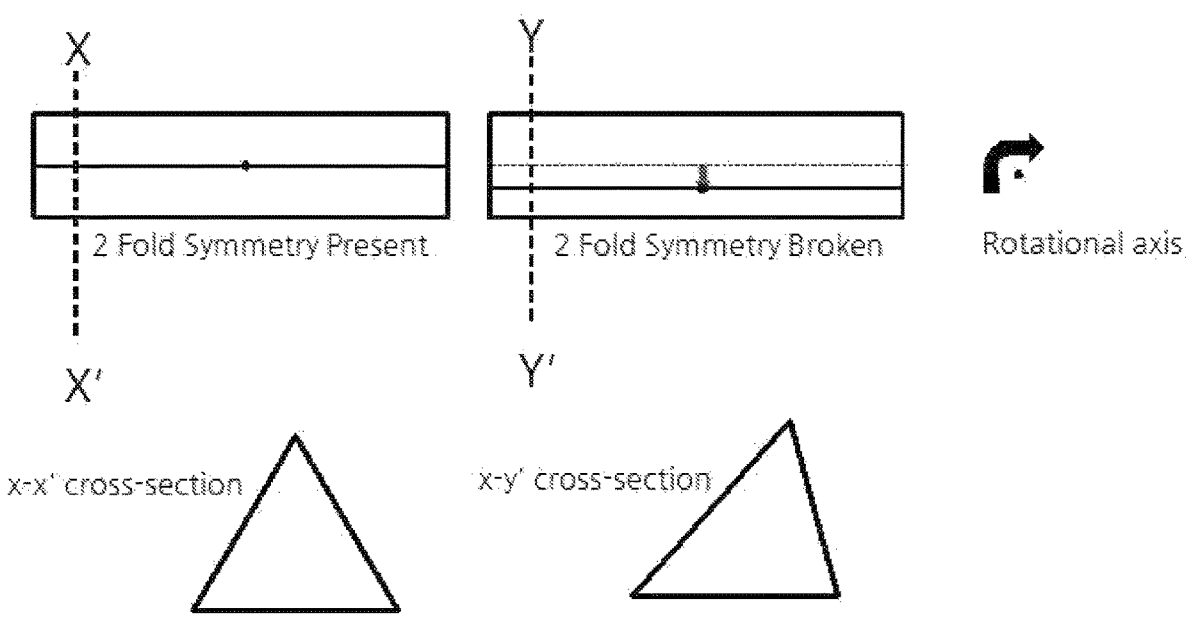

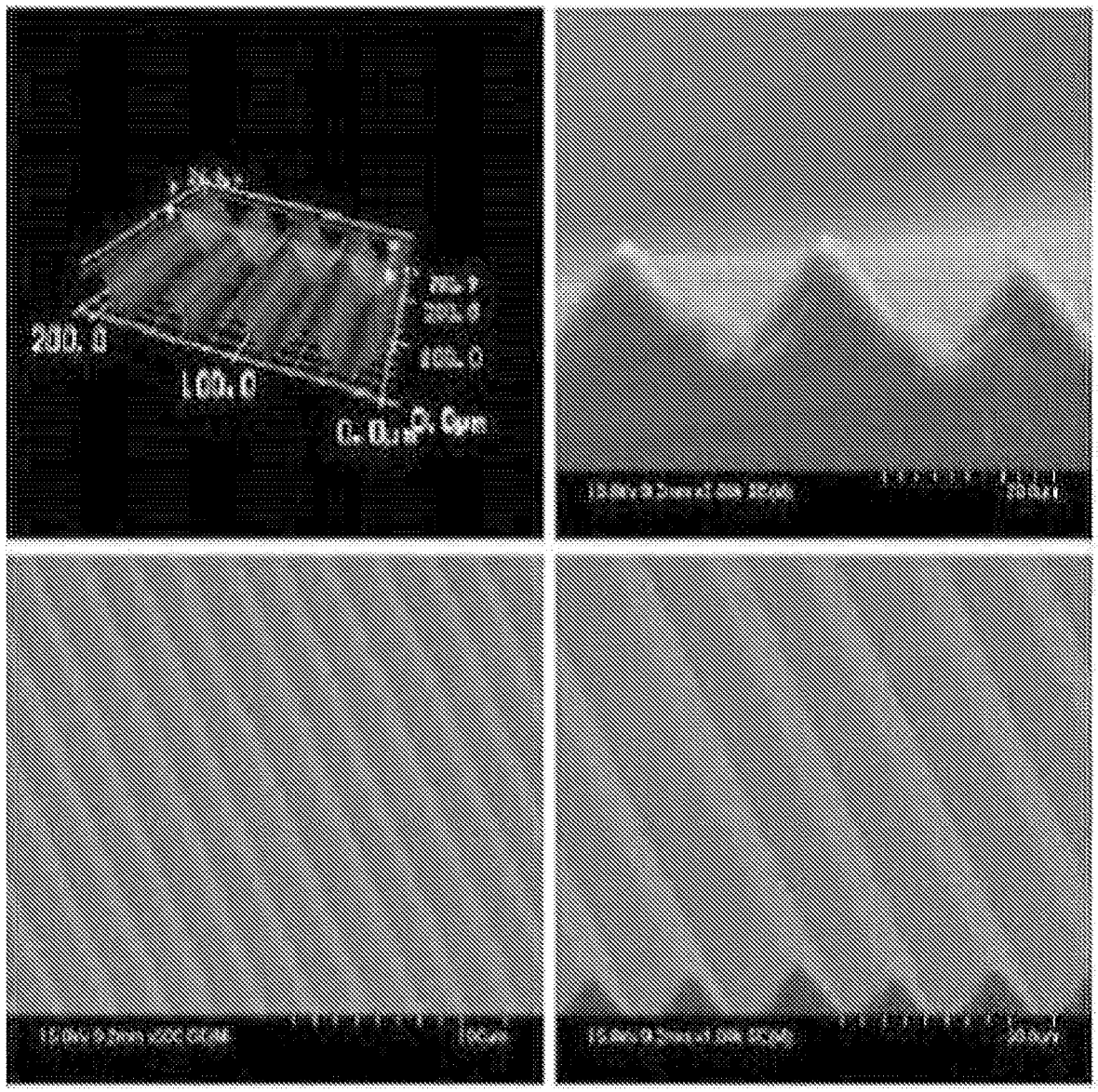
[FIG. 10]

[FIG. 11]
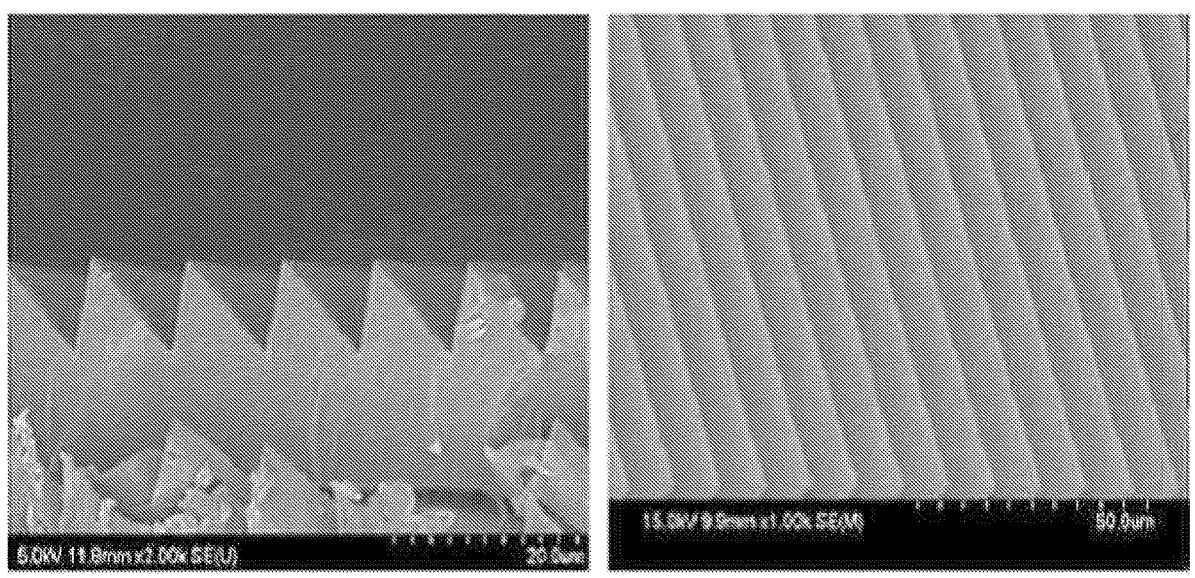

[FIG. 12]
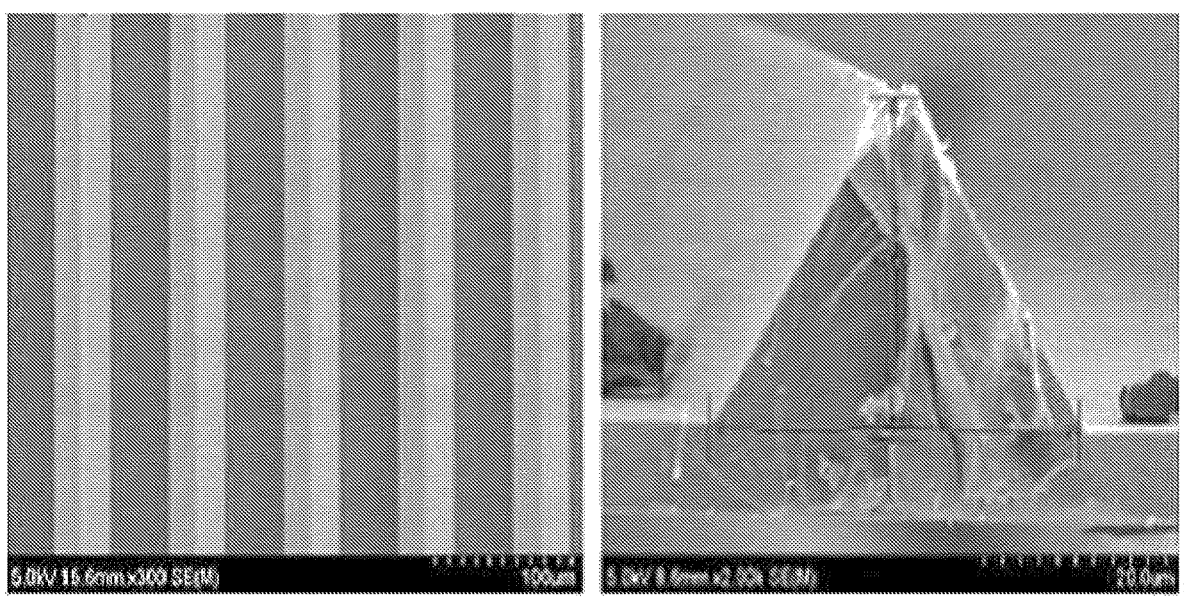

[FIG. 13]
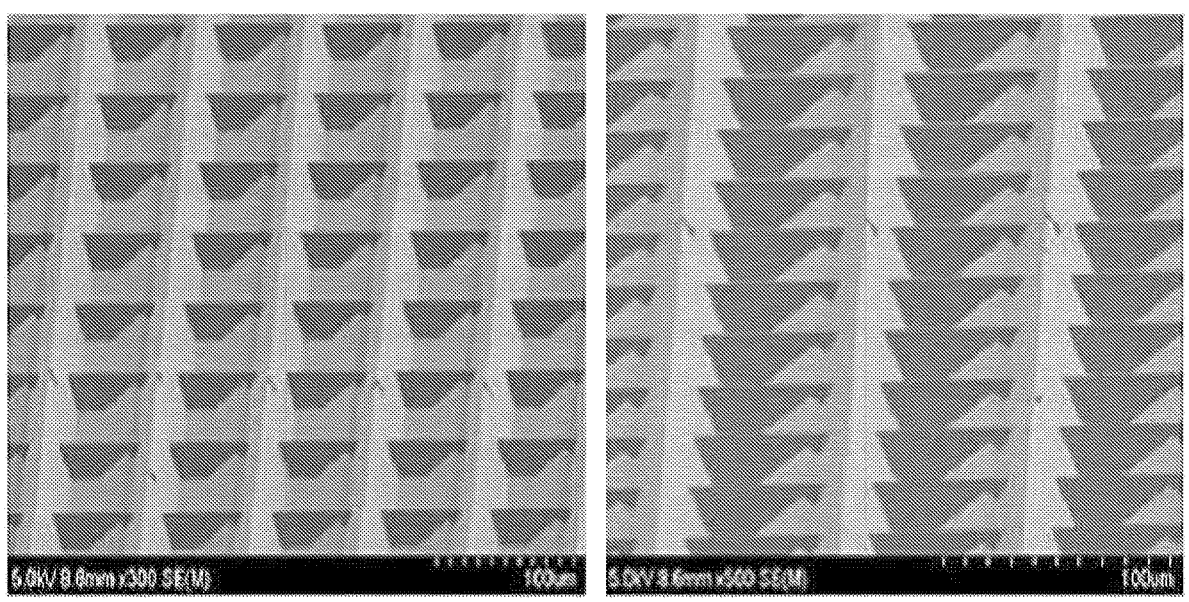

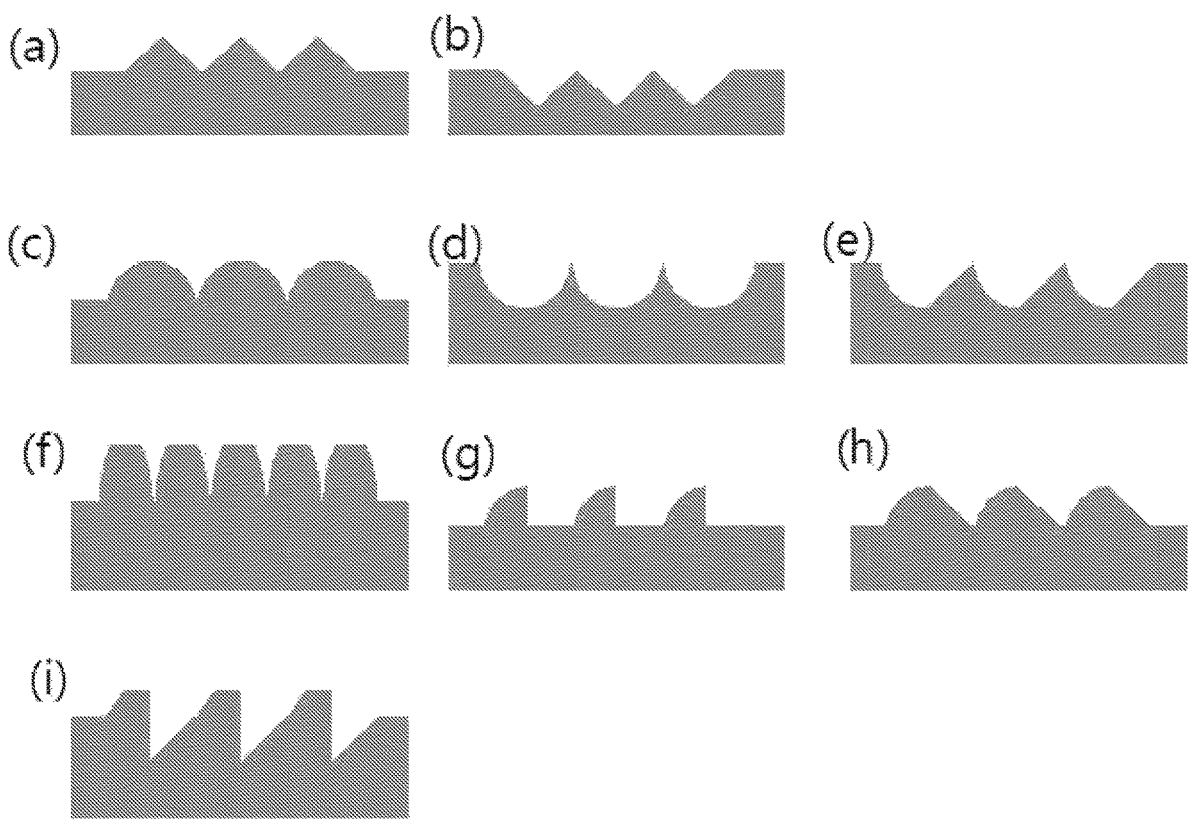
[FIG. 14]

[FIG. 15]
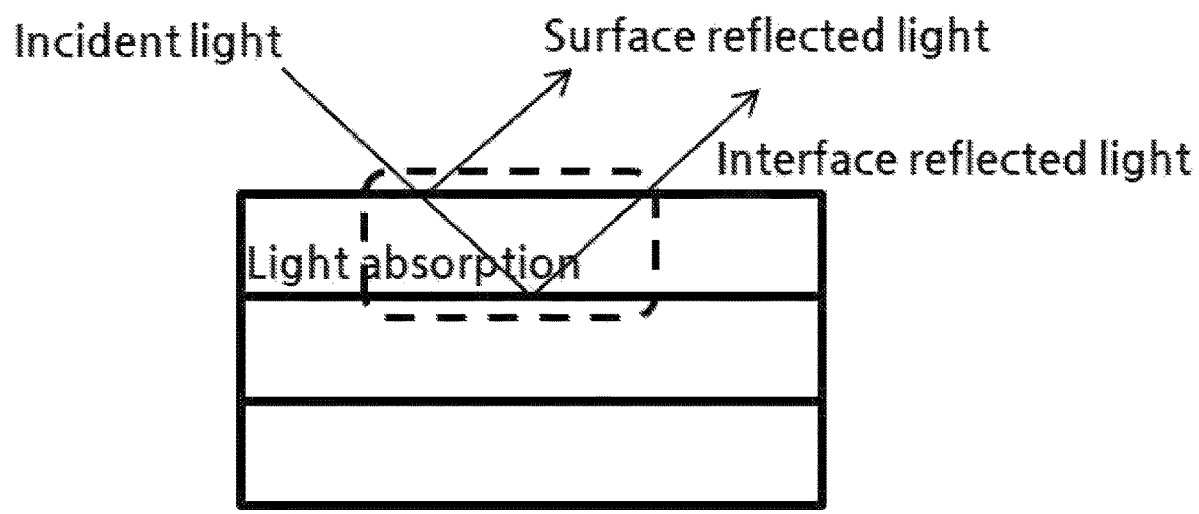

[FIG. 16]
(a) Example 5
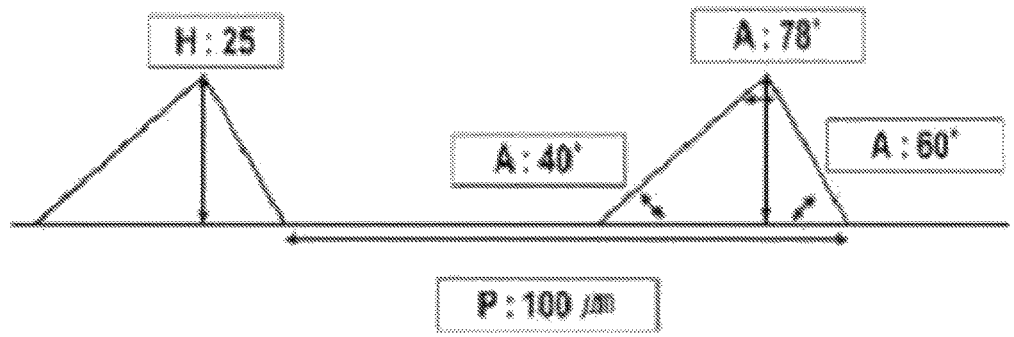
(b) Example 6
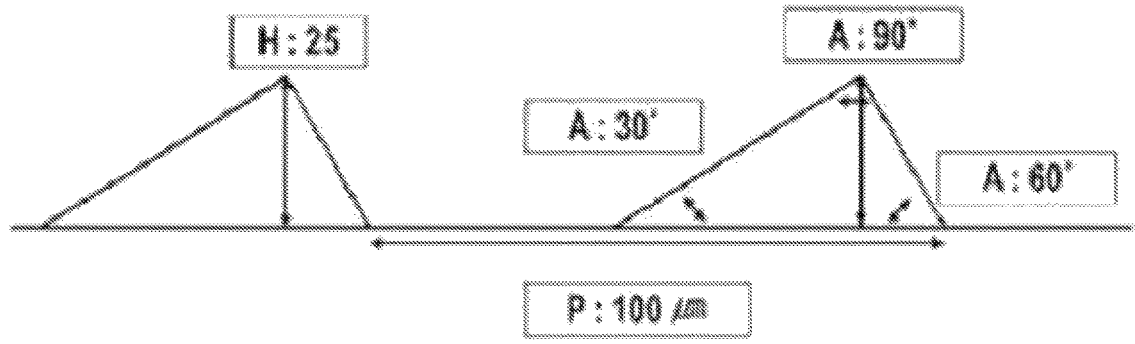
(c) Example 7
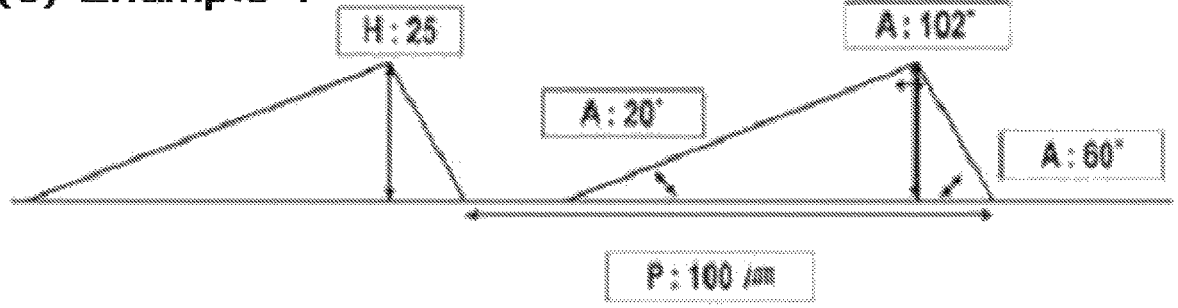

[FIG. 17]
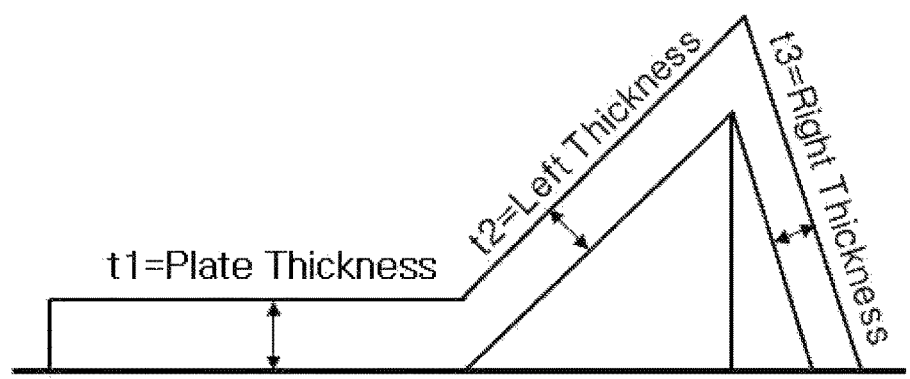
|  | Left | | | Right | | |
|---|---|---|---|---|---|---|
|  | Angle (°) | Thickness (nm) | Color (CIE L*ab) | Angle (°) | Thickness (nm) | Color (CIE L*ab) |
| Example 5 | 40 | 50 | 22,4,4 | 60 | 35 | 48,13,23 |
| Example 6 | 30 | 60 | 36,2,7 | 60 | 35 | 48,13,23 |
| Example 7 | 20 | 66 | 28,1,-11 | 60 | 35 | 48,13,23 |

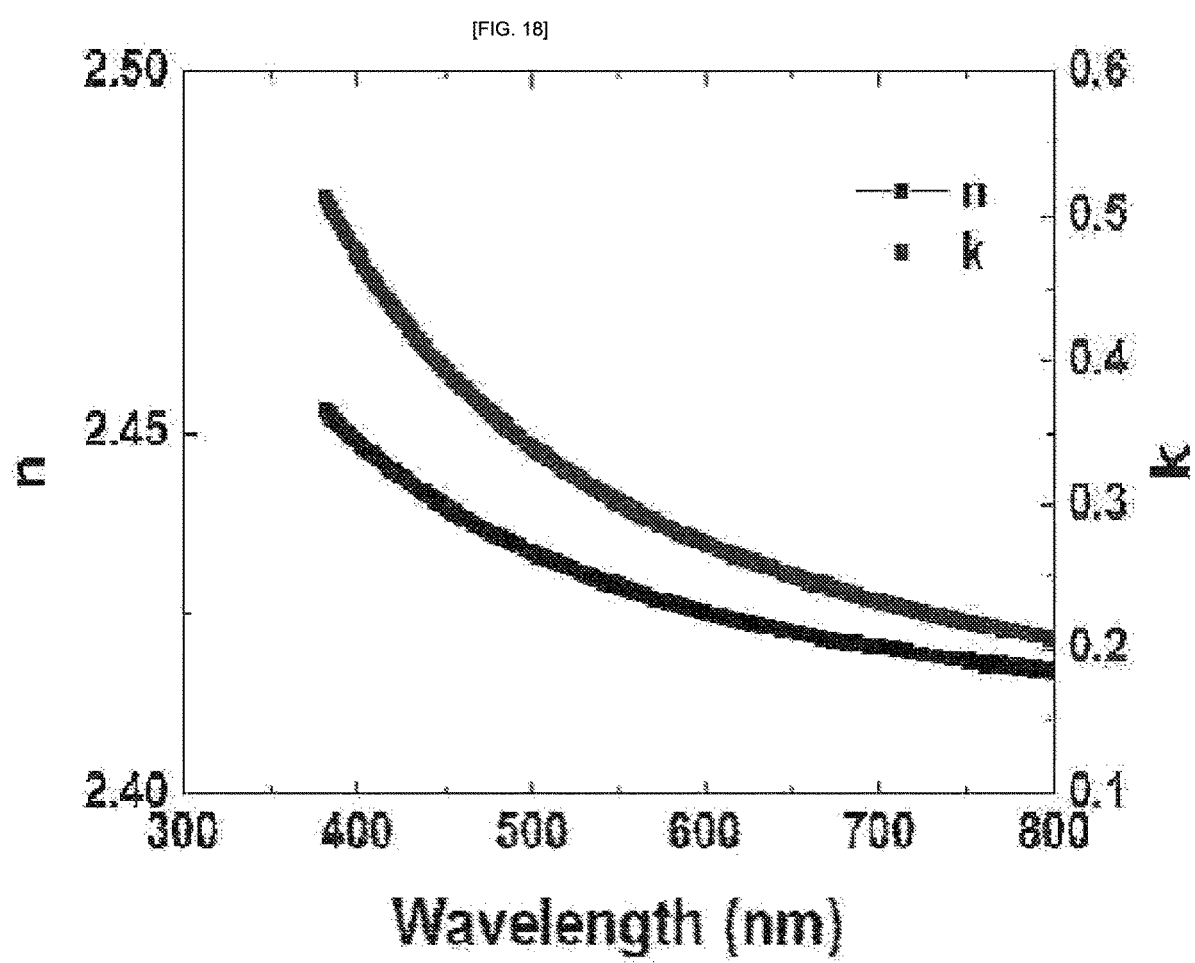
[FIG. 18]

[FIG. 19]
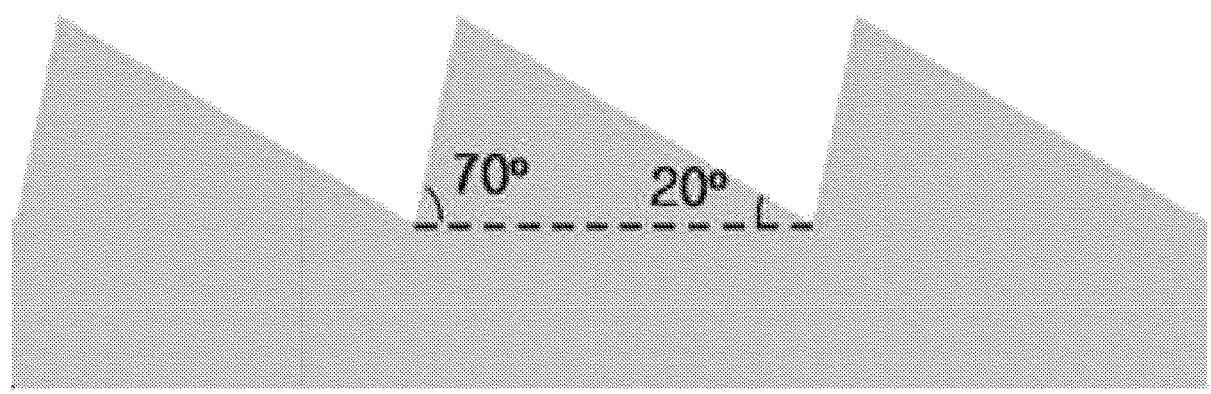

[FIG. 20]
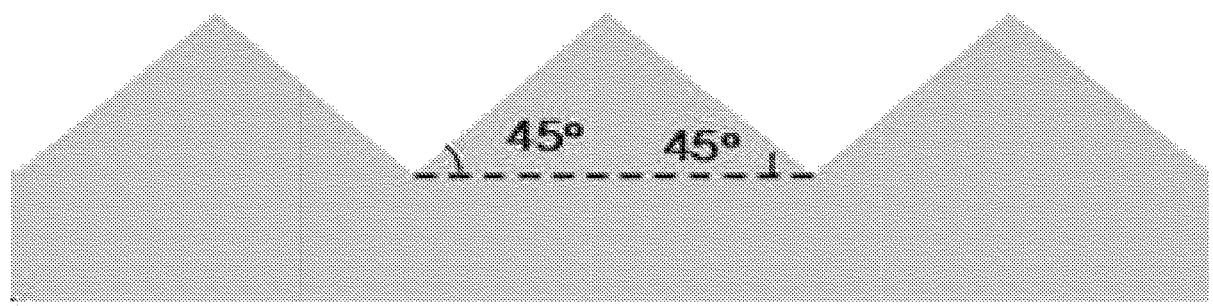

[FIG. 21]

|  | Angle(°) | | Thickness(nm) | | Color(CIE L*ab) | |
| --- | --- | --- | --- | --- | --- | --- |
|  | Left | Right | Left | Right | Left | Right |
| Example 8 | 70 | 20 | 5.7 | 3.7 | 54,7,4 | 90,0,10 |
| Example 9 | 70 | 20 | 19.0 | 12.2 | 57,11,62 | 53,7,4 |
| Comparative Example 2 | 45 | 45 | 6.3 | 6.3 | 52,7,4 | 52,7,4 |

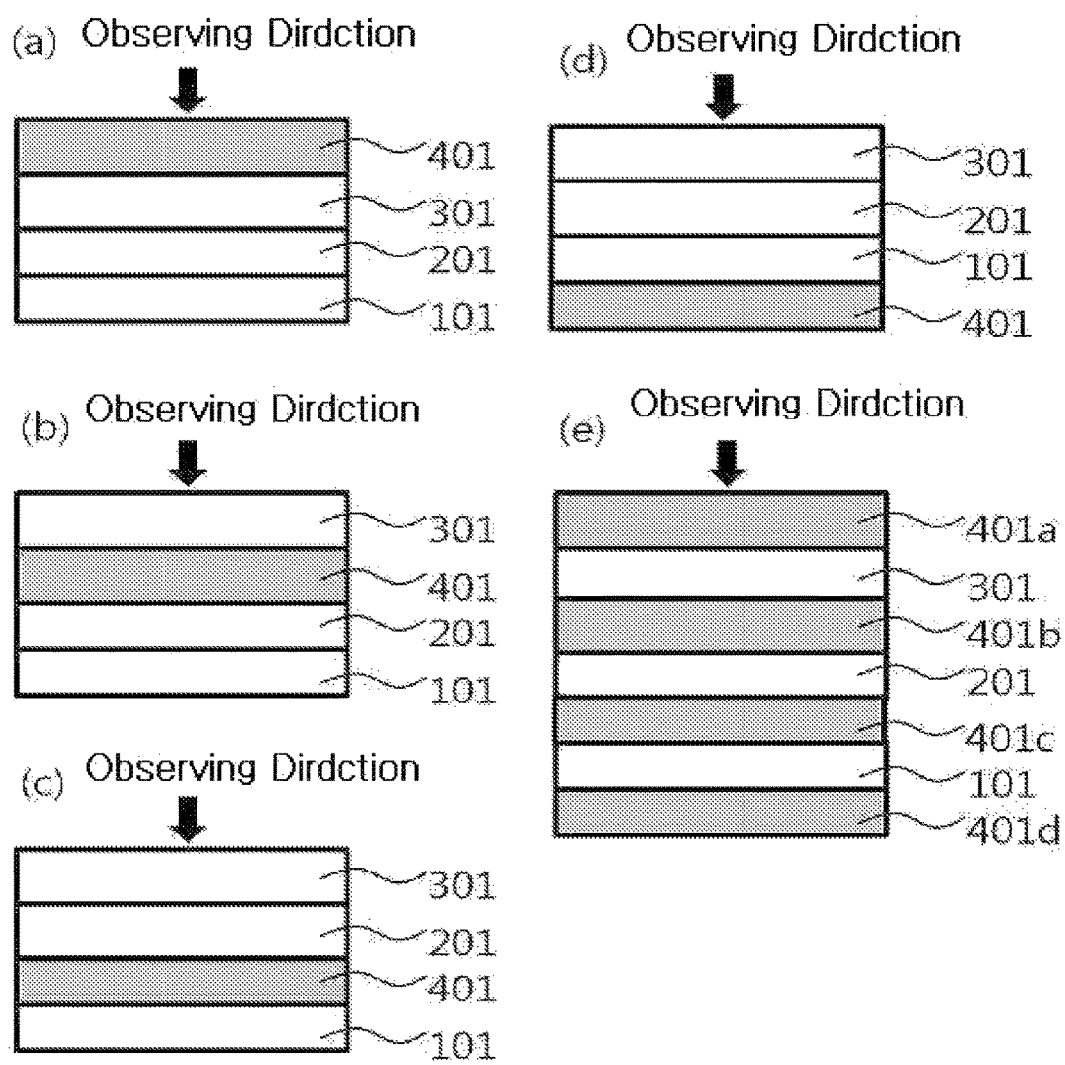
[FIG. 22]

[FIG. 23]
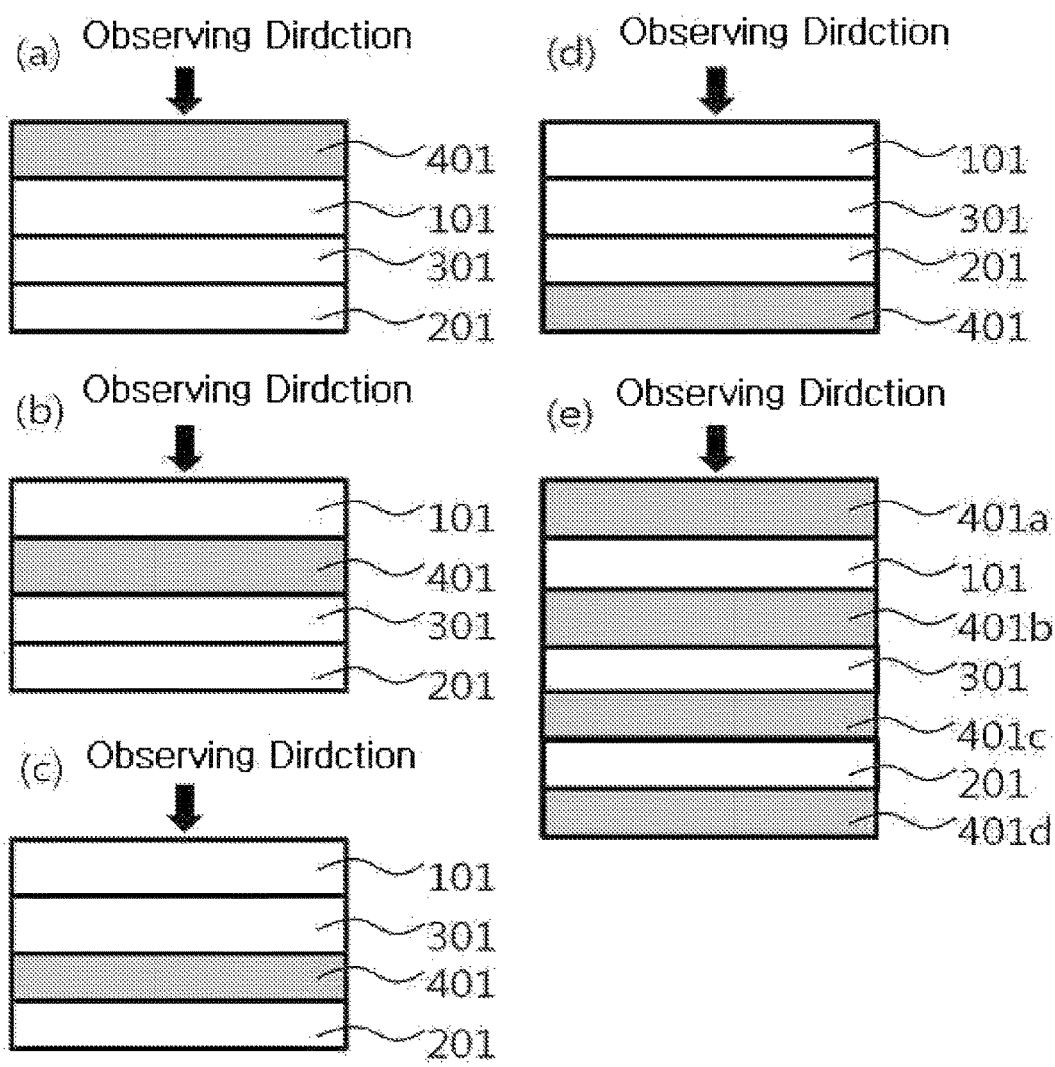

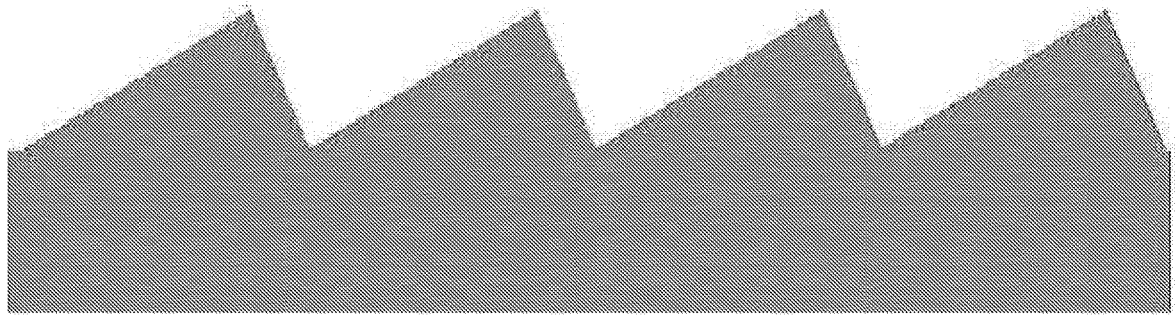
[FIG. 24]

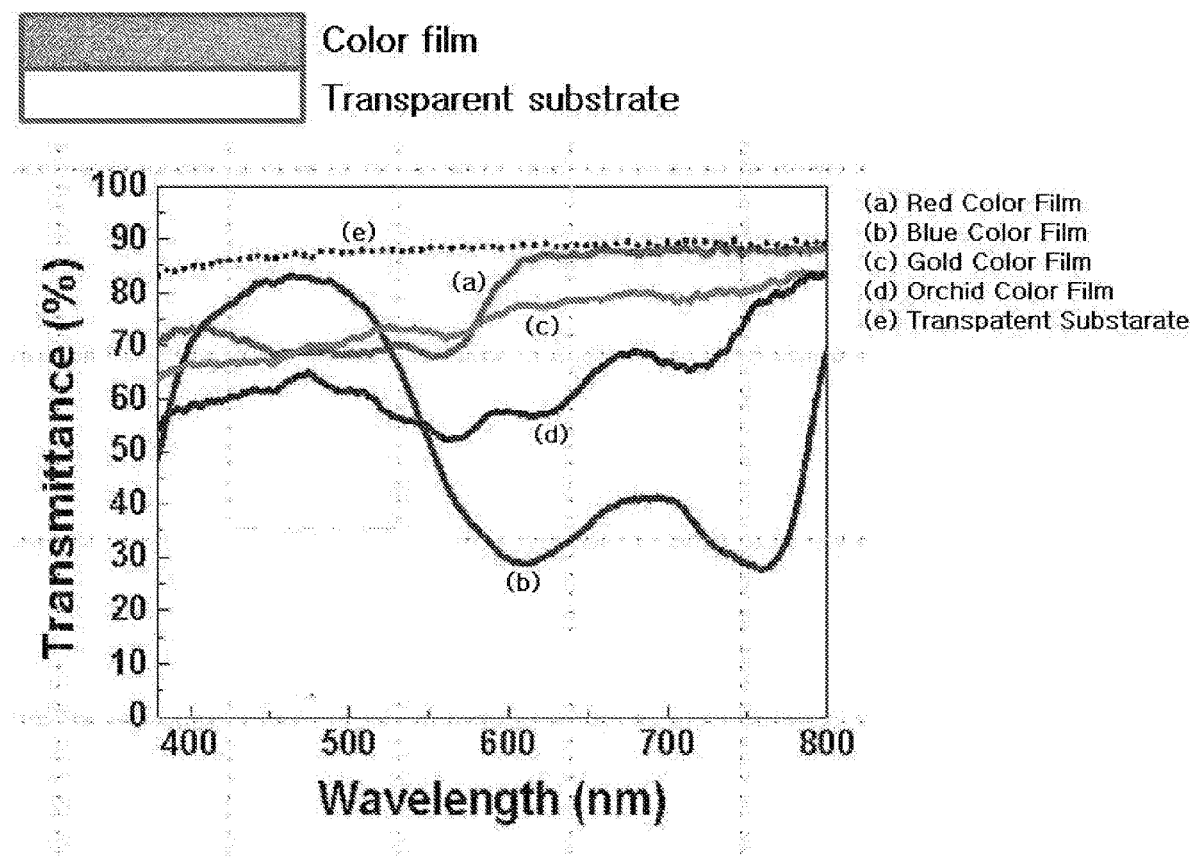

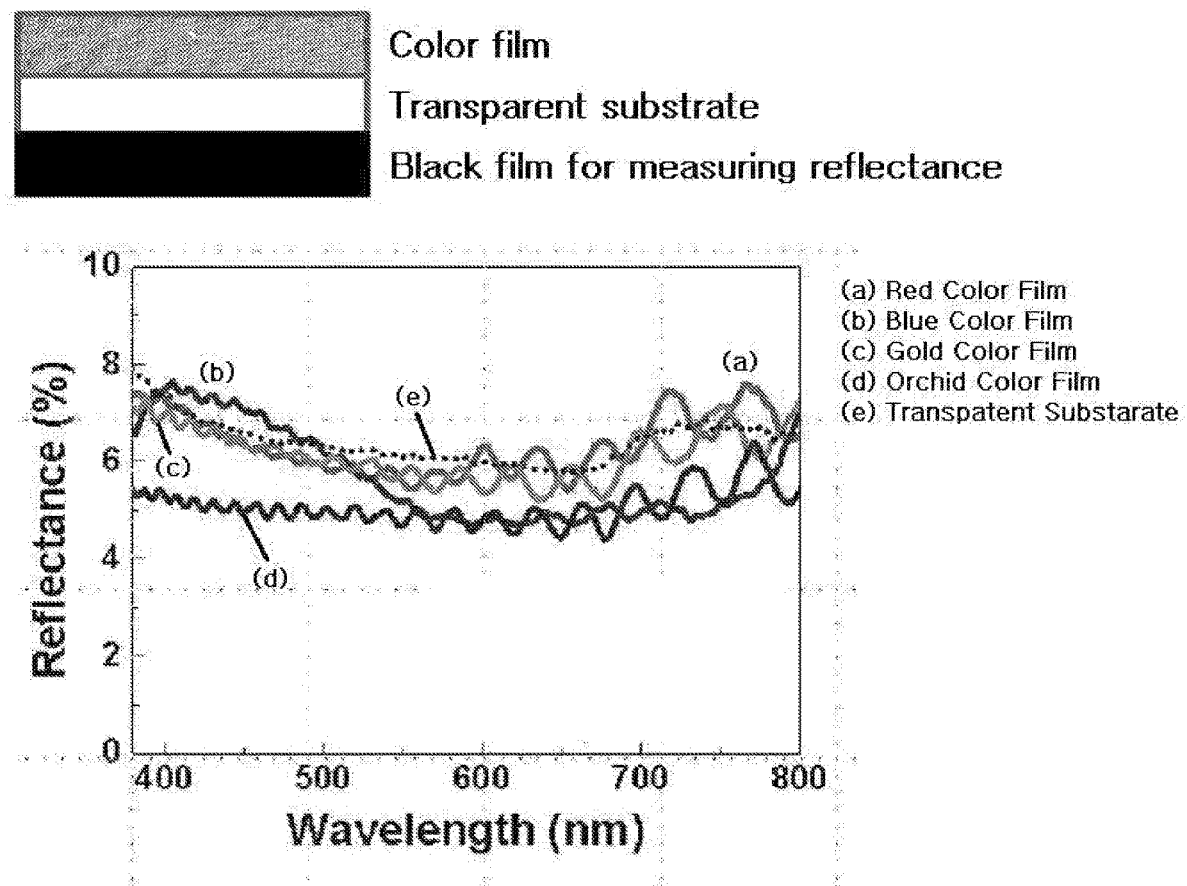
[FIG. 26]

[FIG. 27]
| Observe through air | Dichroic decoration element 1 30nm/10nm | | Dichroic decoration element 2 80nm/30nm | | Dichroic decoration element 3 140nm/130nm | |
|---|---|---|---|---|---|---|
| | Left View | Right View | Left View | Right View | Left View | Right View |
| ADD RED COLOR FILM EXAMPLES 10 to 12 | 66,0,22 | 76,3,2 | 57,-4,-7 | 66,-2,22 | 54,7,4 | 56,8,37 |
| ADD RED COLOR FILM EXAMPLES 13 to 15 | 52,1,14 | 59,-3,7 | 50,-3,-6 | 52,0,16 | 45,4,27 | 37,2,16 |
| ADD RED COLOR FILM EXAMPLES 16 to 18 | 51,-1,20 | 71,0,4 | 54,-4,-7 | 61,-1,20 | 51,7,31 | 41,8,4 |
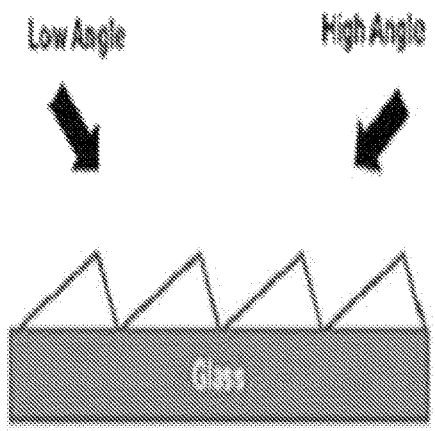

[FIG. 28]
| Observe through air | 30nm/10nm | | 80nm/30nm | | 140nm/130nm | |
|---|---|---|---|---|---|---|
| | Dichroic decoration element 1 | | Dichroic decoration element 2 | | Dichroic decoration element 3 | |
| | Left View | Right View | Left View | Right View | Left View | Right View |
| ADD RED COLOR FILM EXAMPLES 19 to 21 | 67,0,17 | 70,-24,6 | 52,-1,-7 | 66,-1,17 | 50,8,30 | 51,6,9 |
| ADD RED COLOR FILM EXAMPLES 22 to 24 | 52,0,12 | 58,-1,3 | 47,-3,-2 | 53,0,11 | 40,1,23 | 43,4,7 |
| ADD RED COLOR FILM EXAMPLES 25 to 27 | 61,-1,13 | 69,3,2 | 49,-3,-2 | 63,-1,13 | 47,6,26 | 47,7,7 |
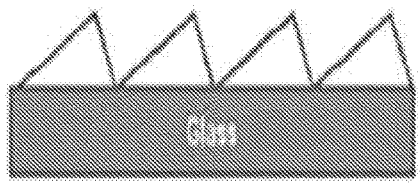
High Angle    Low Angle

[FIG. 29]
| | Example 28 | |
|---|---|---|
| | High Angle | Low Angle |
| L* | 35.31 | 31.64 |
| a* | -3.03 | 0.22 |
| b* | -14.08 | -6.55 |
| Color | | |
| Color difference between high angle and low angle | 0 | 8.99 |
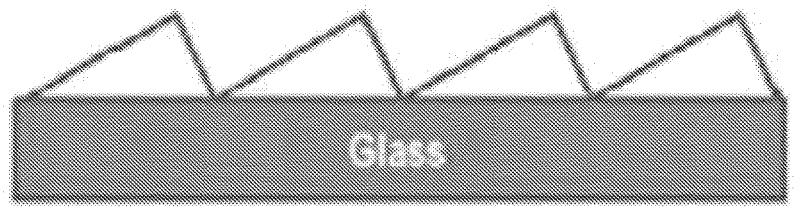
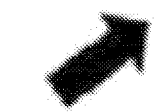 
High Angle　　　　　　　　　Low Angle

[FIG. 30]
Thin film structure
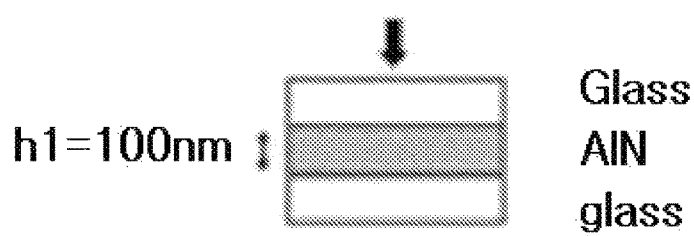
Viewing Angle-dependent Color Change
Example 1
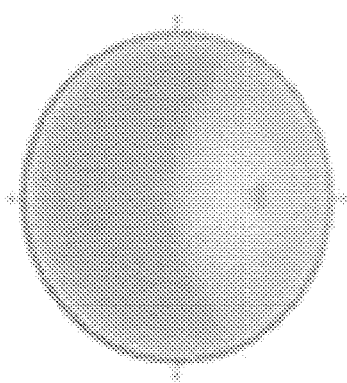
Comparative Example 1
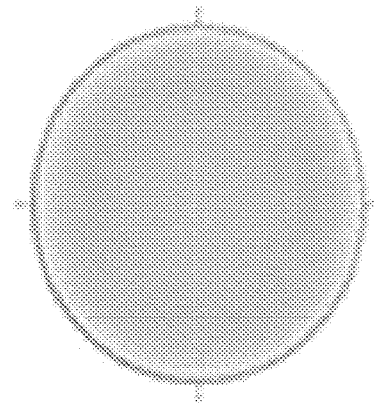

[FIG. 31] Changes in Lab values depending on Viewing angle
Example 1
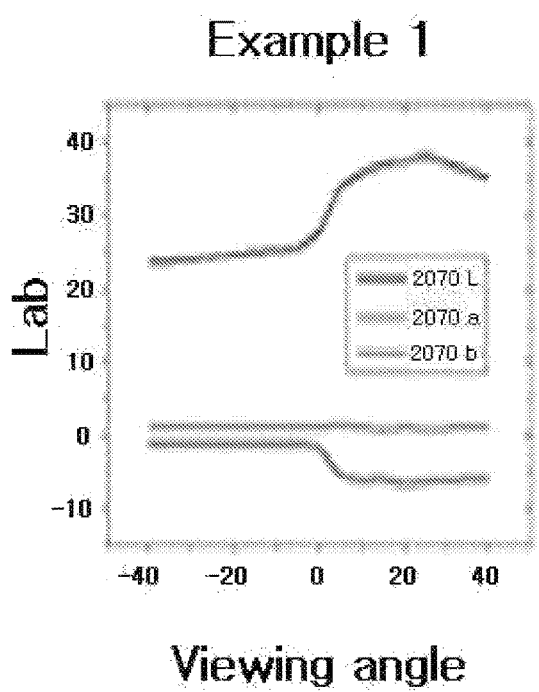
Comparative Example 1
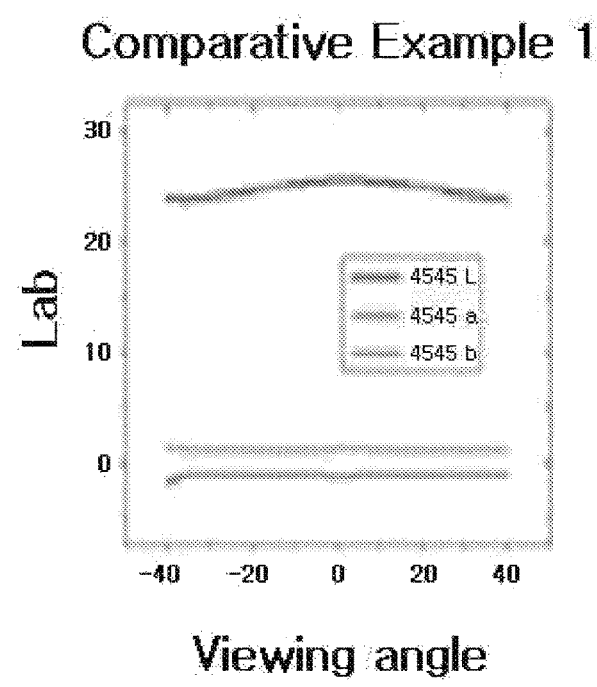

[FIG. 32]
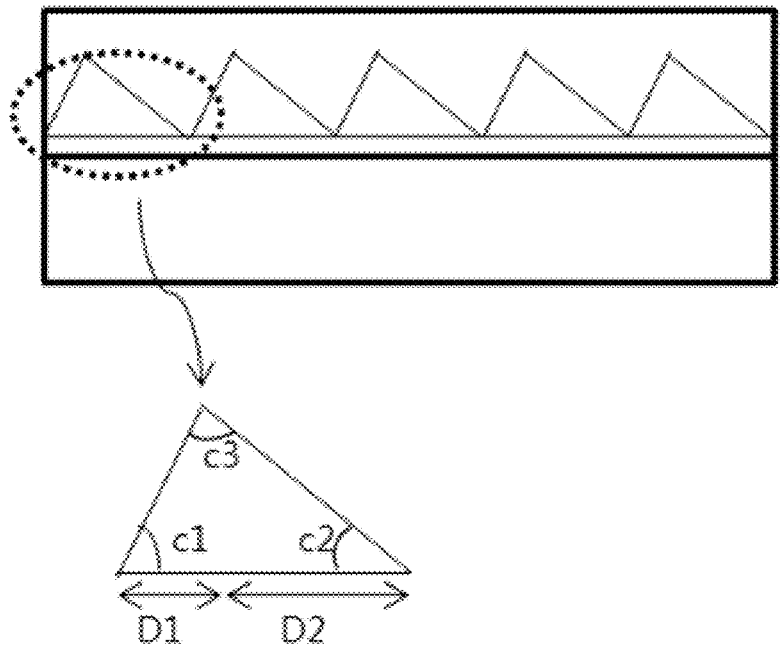
① First inclined side
② Second inclined side
[FIG. 33]
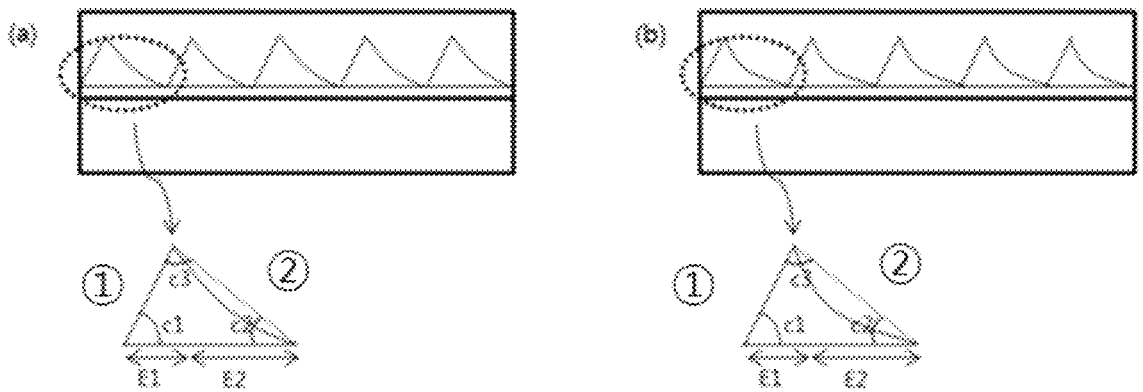
① First inclined side
② Second inclined side

[FIG. 34]
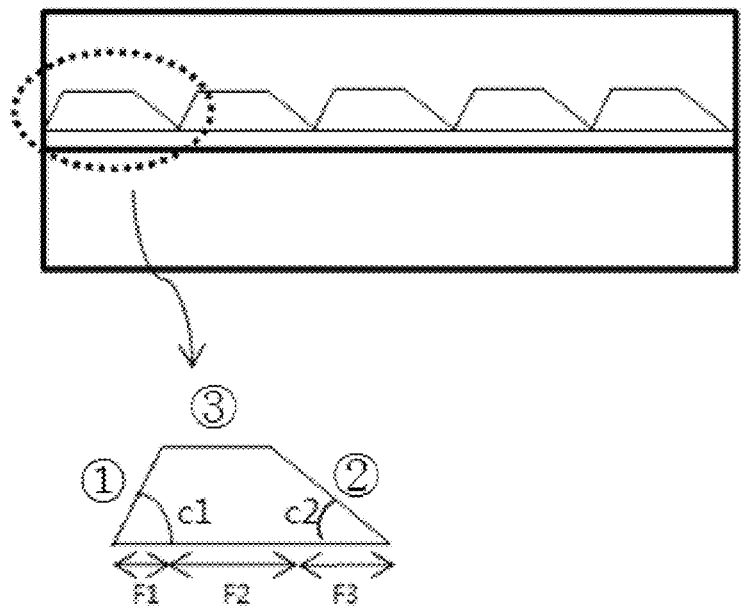
① First inclined side
② Second inclined side
③ Third inclined side
[FIG. 35]
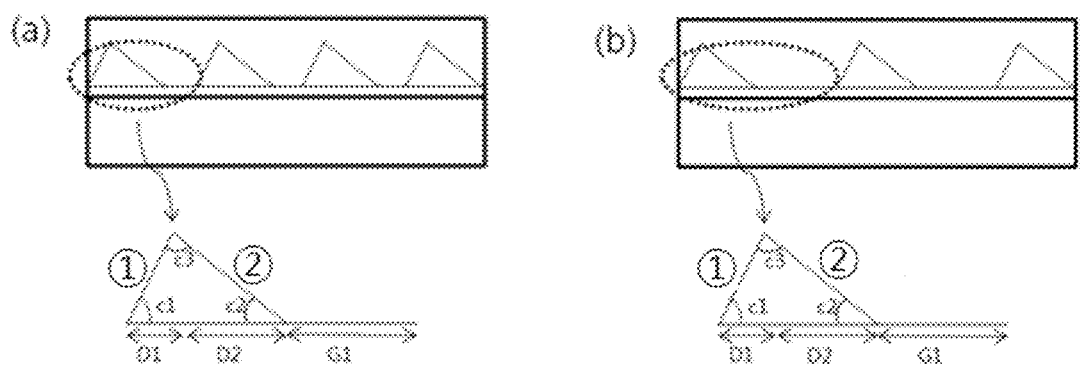
① First inclined side
② Second inclined side

[FIG. 36]
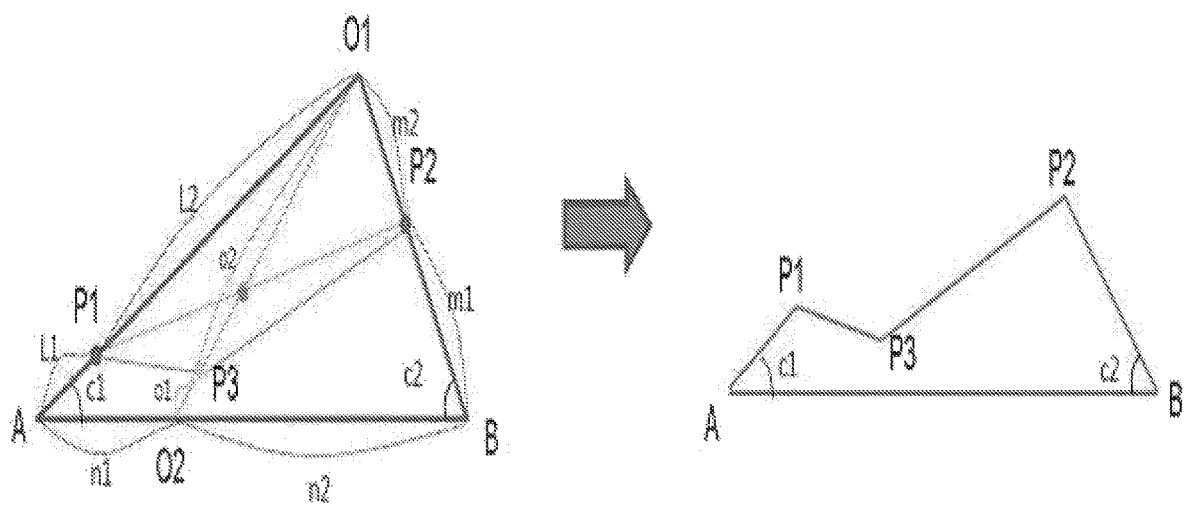

[FIG. 37]
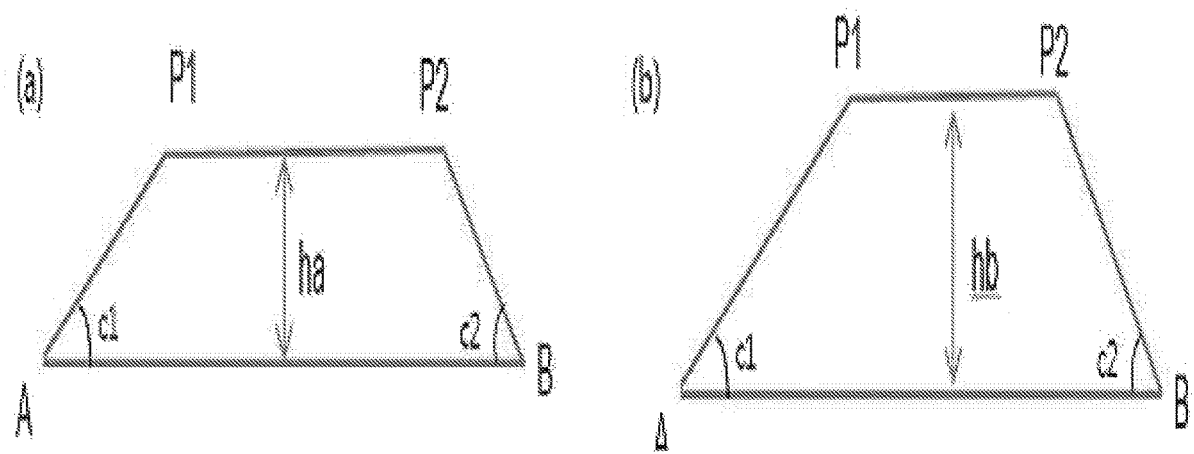

[FIG. 38]
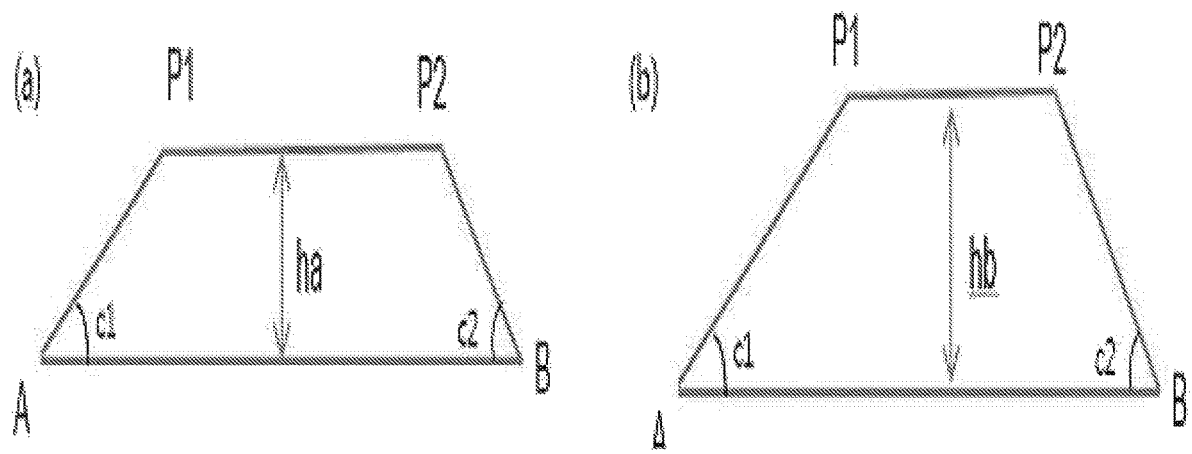

[FIG. 39]
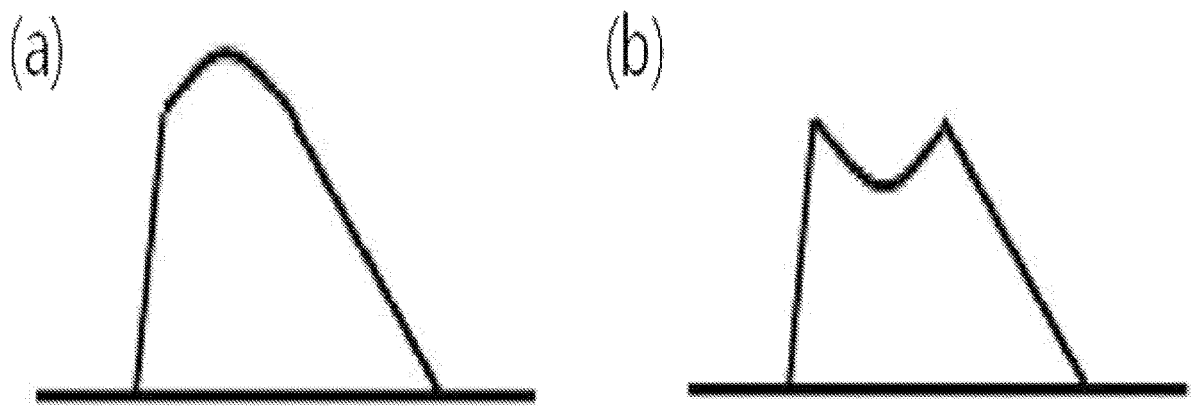

[FIG. 40]
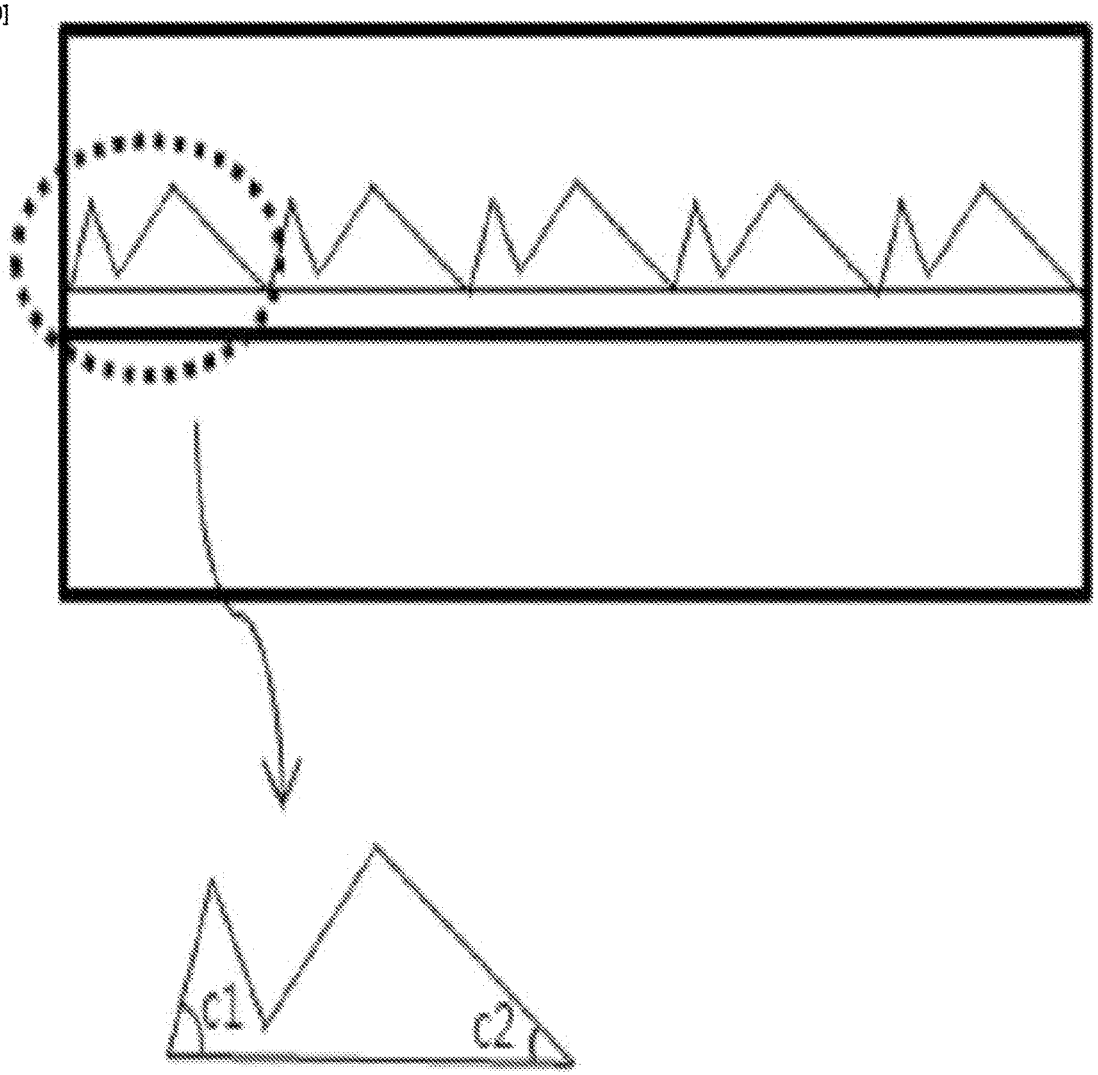

[FIG. 41]
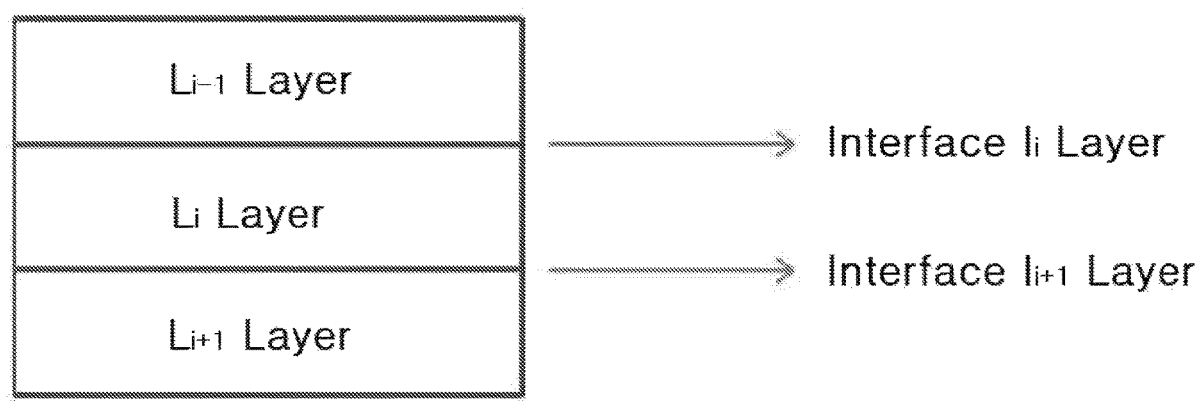

[FIG. 42]
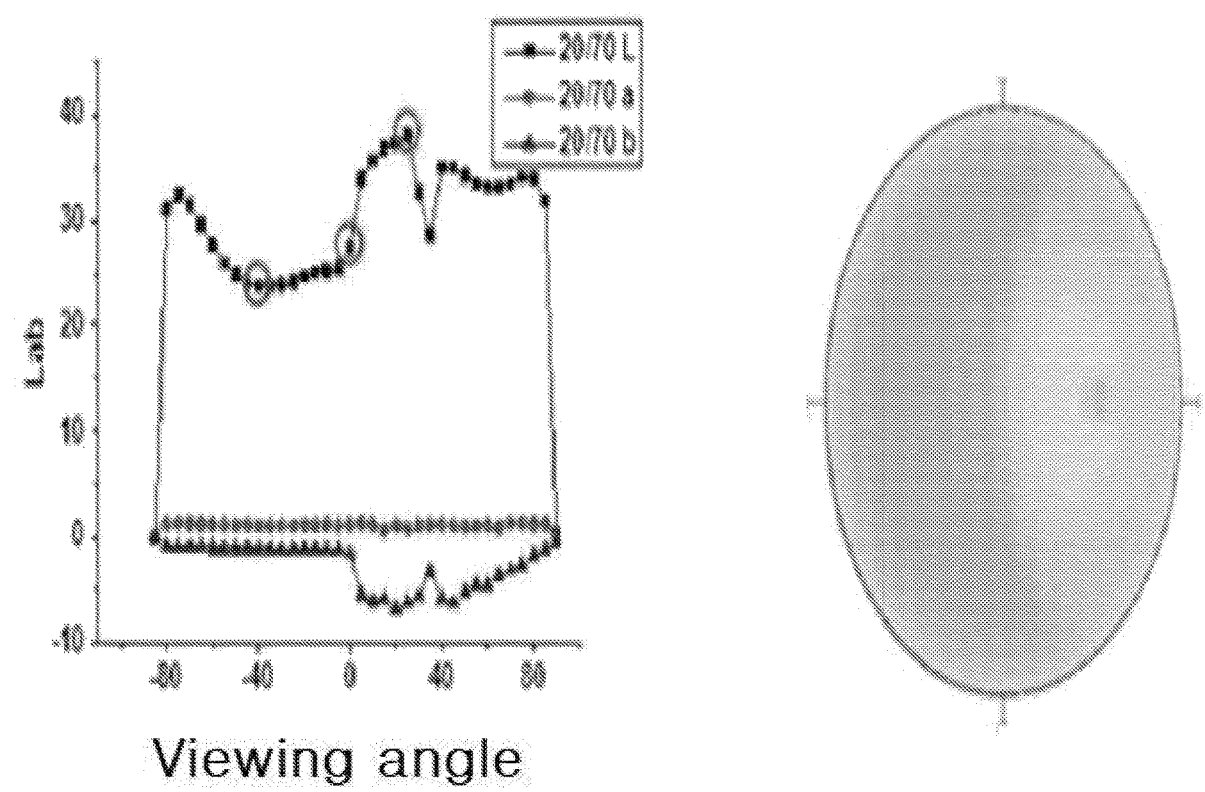

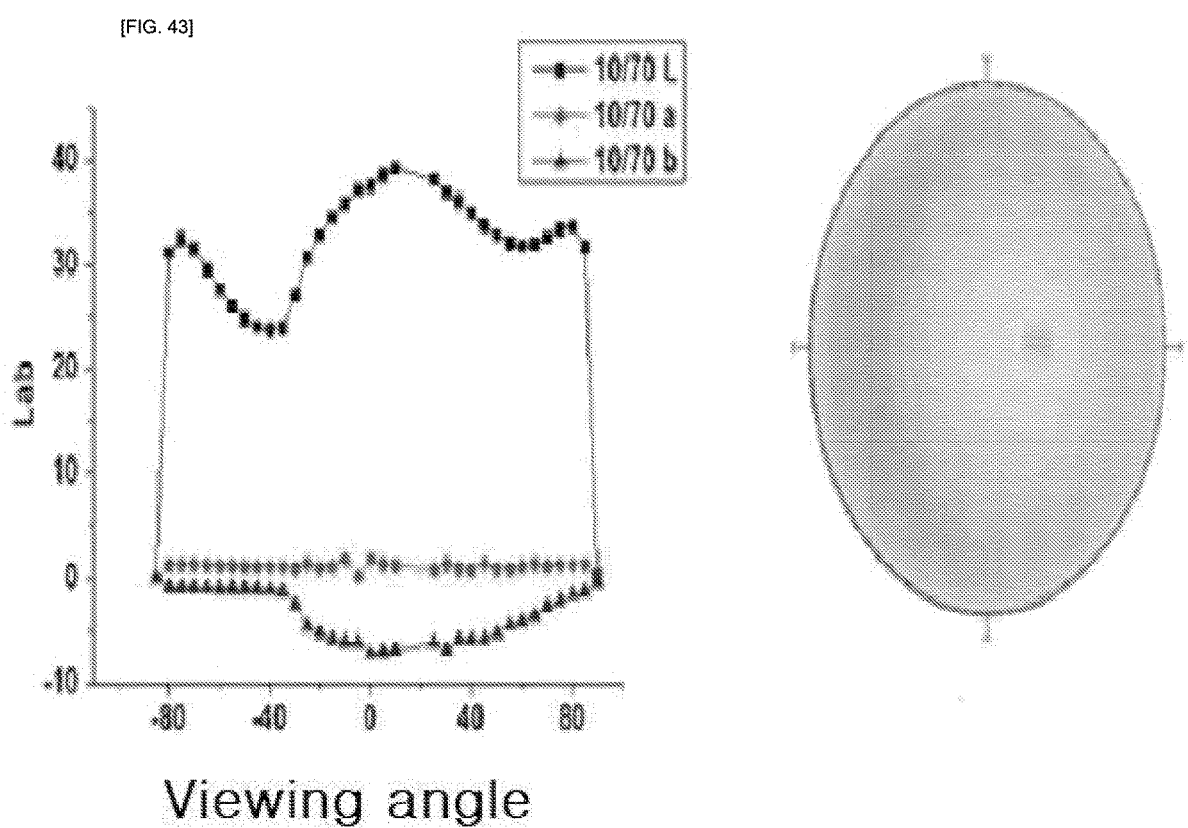
[FIG. 43]

[FIG. 44]
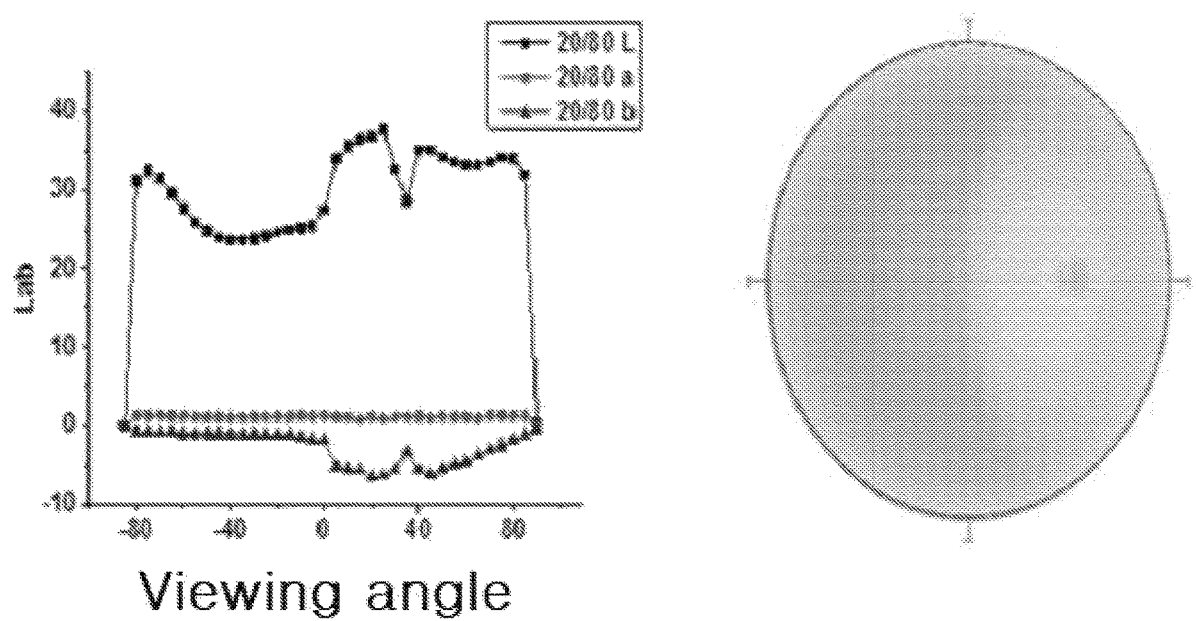

[FIG. 45]
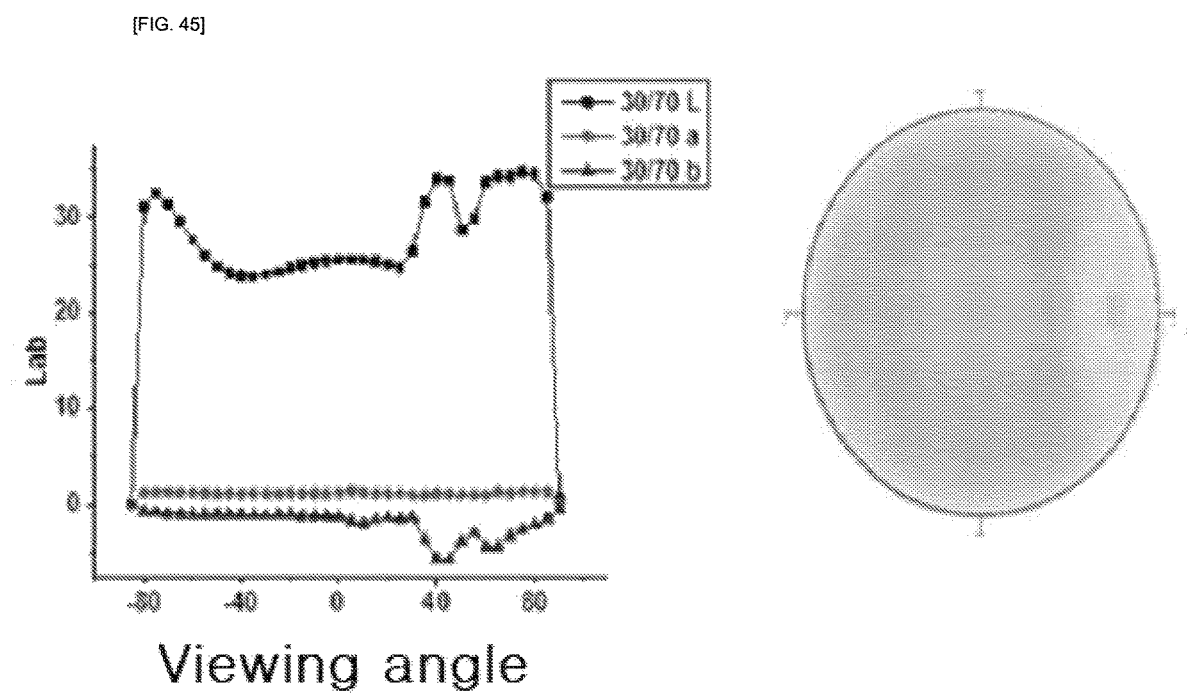

[FIG. 46]
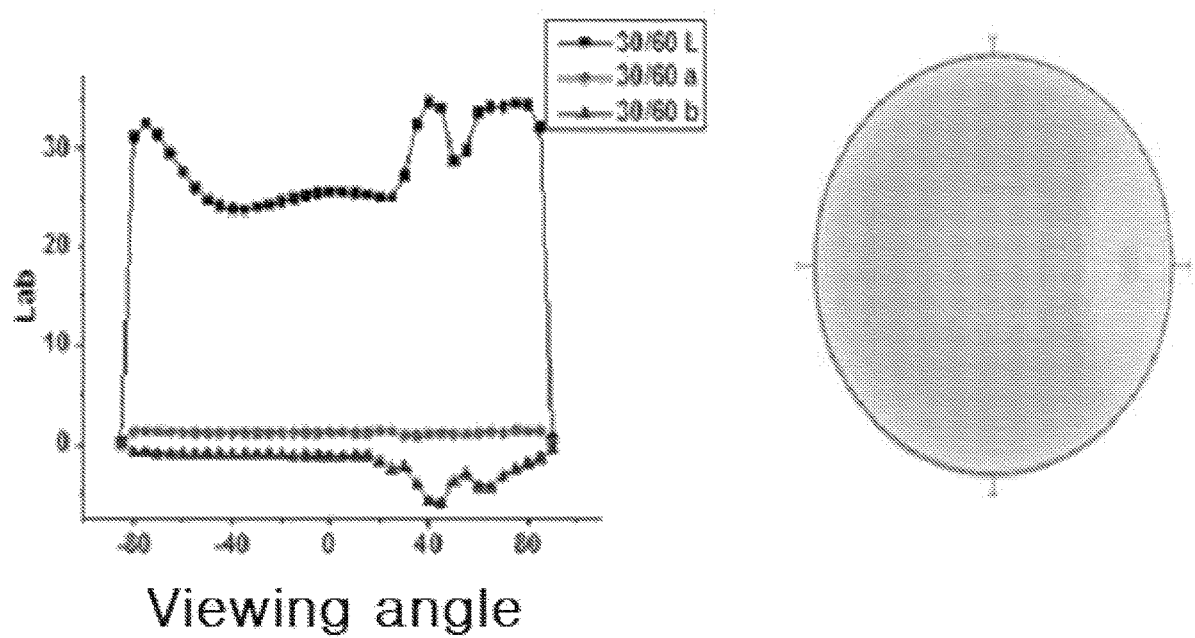

[FIG. 47]
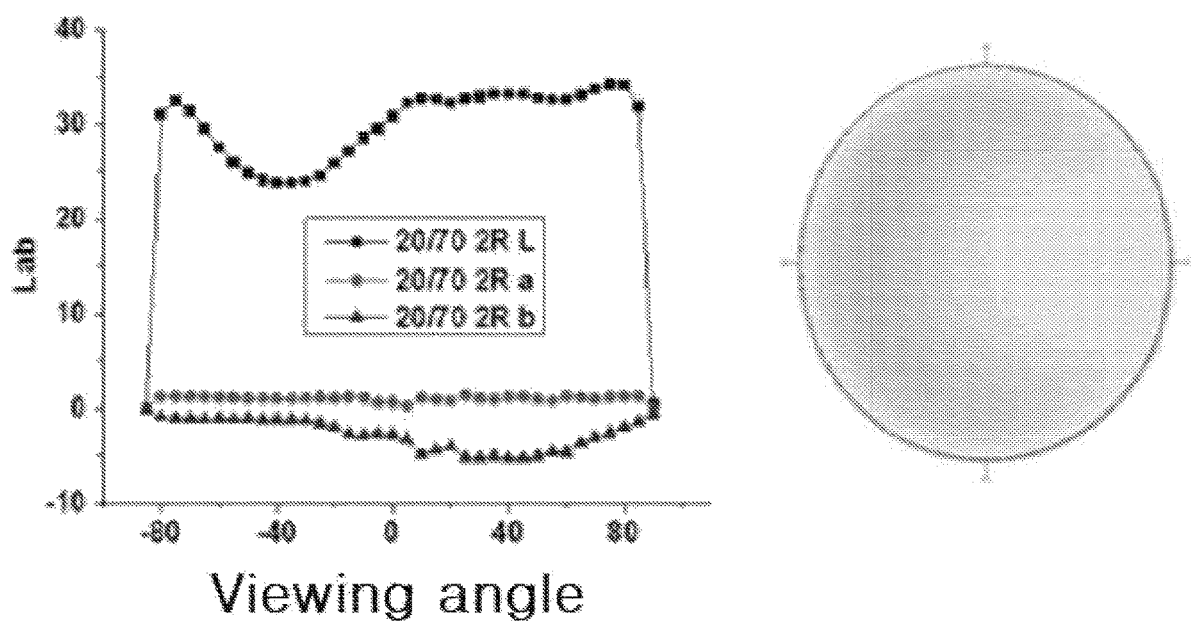

[FIG. 48]
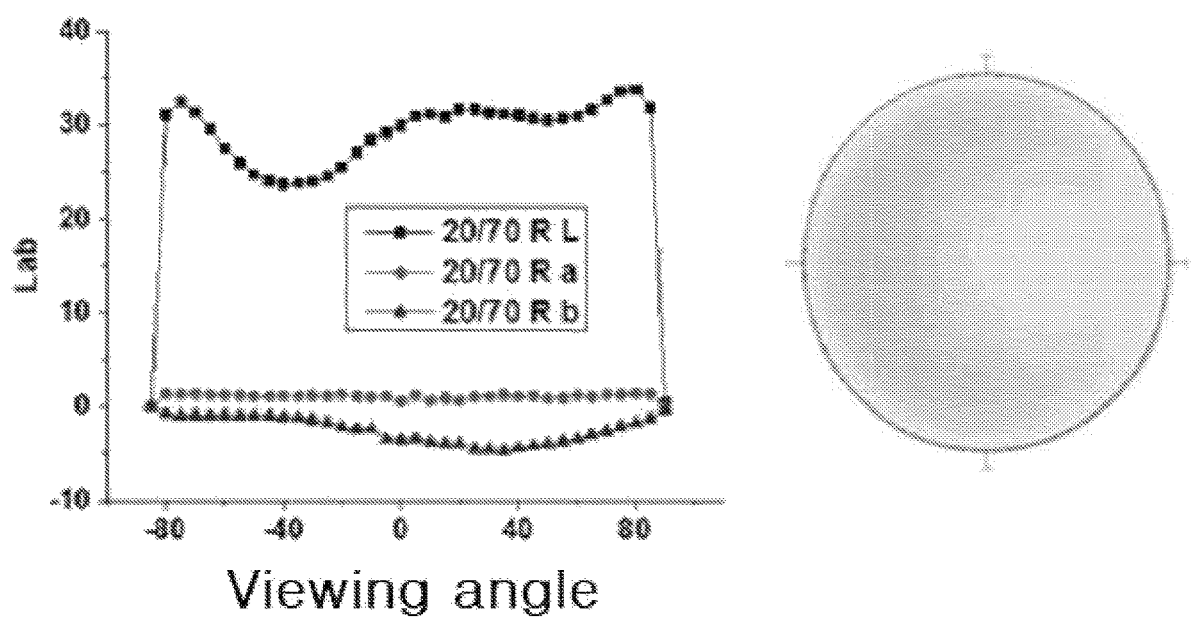

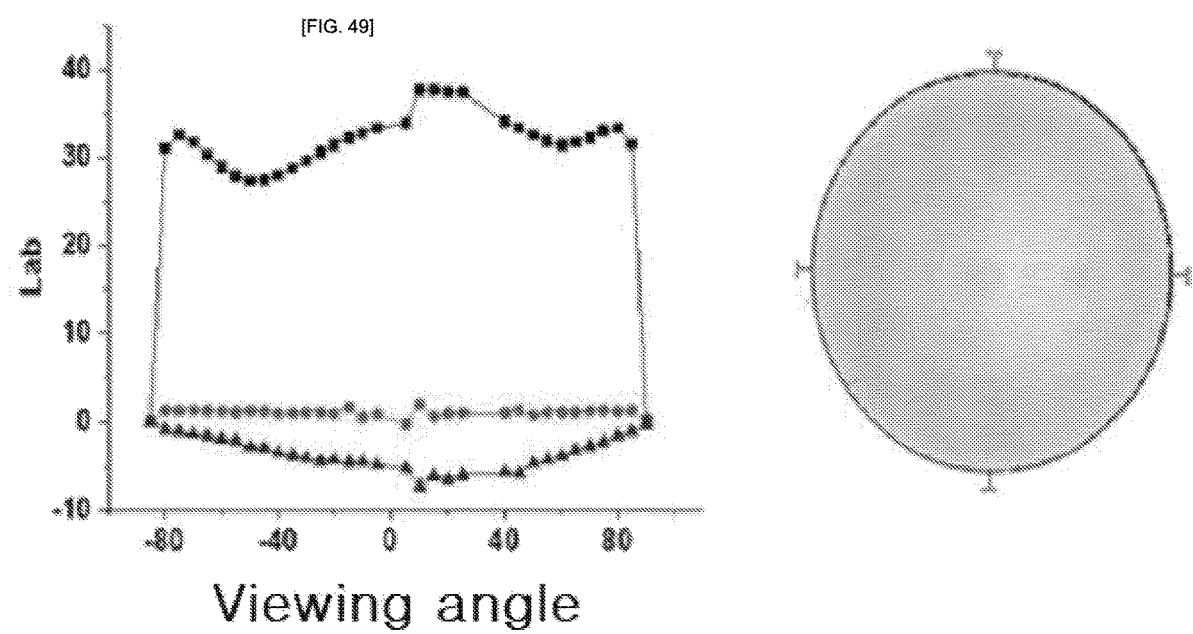
[FIG. 49]
① Shape adjusting Prism 1 L
② Shape adjusting Prism 1 a
③ Shape adjusting Prism 1 b

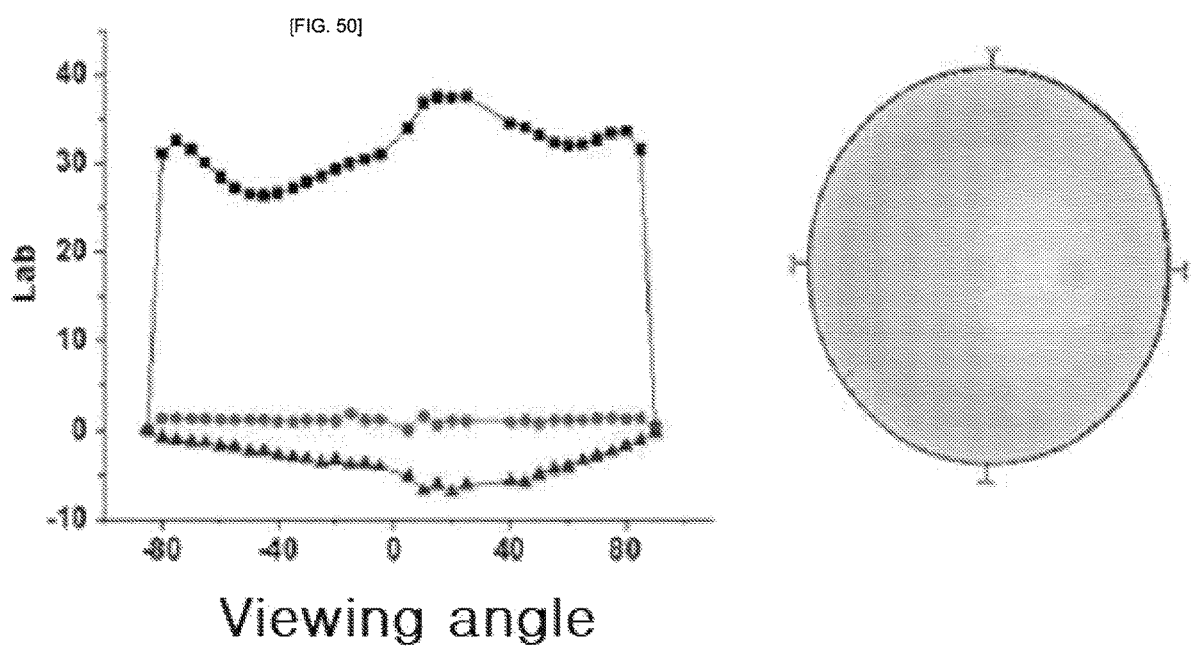
[FIG. 50]
① Shape adjusting Prism 2 L
② Shape adjusting Prism 2 a
③ Shape adjusting Prism 2 b

[FIG. 51]
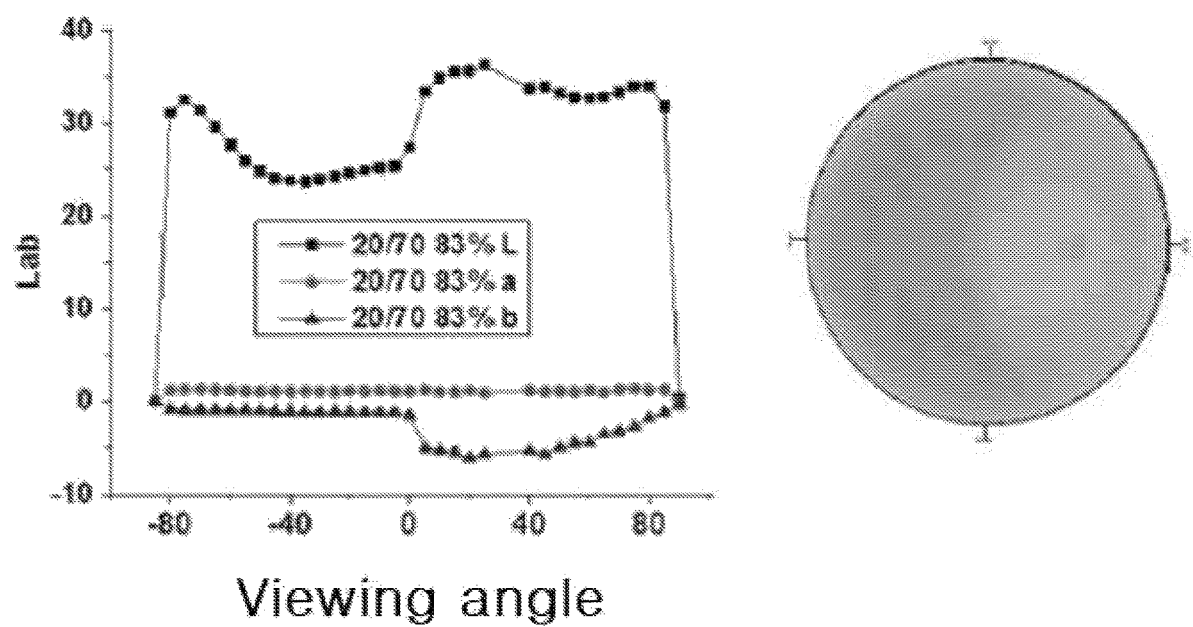

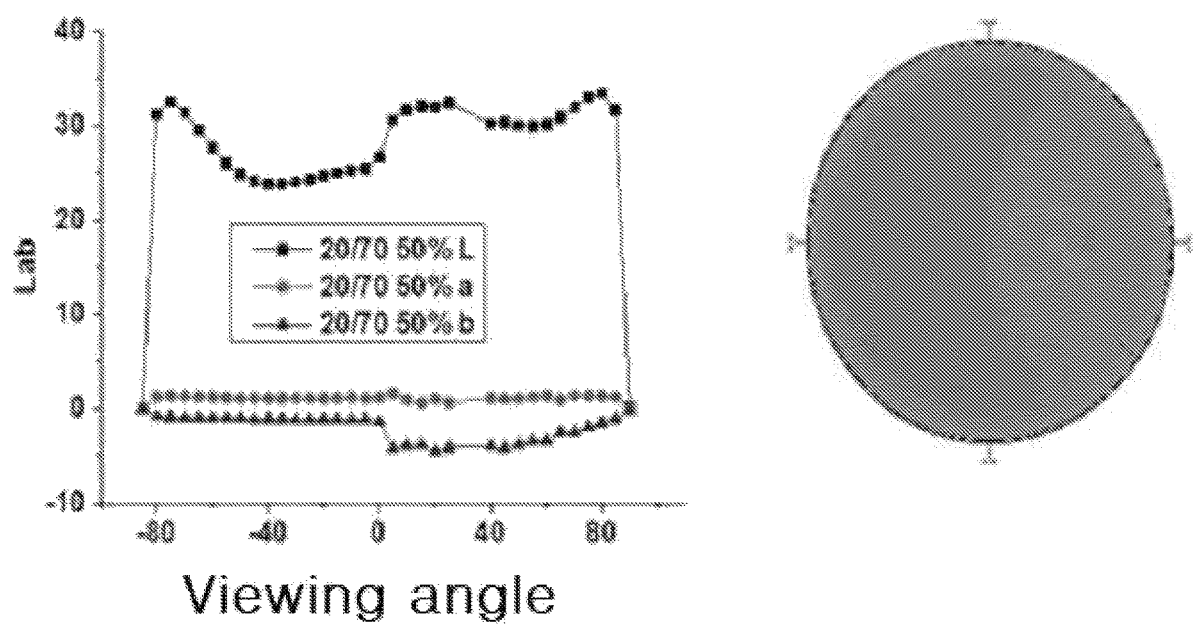
[FIG. 52]

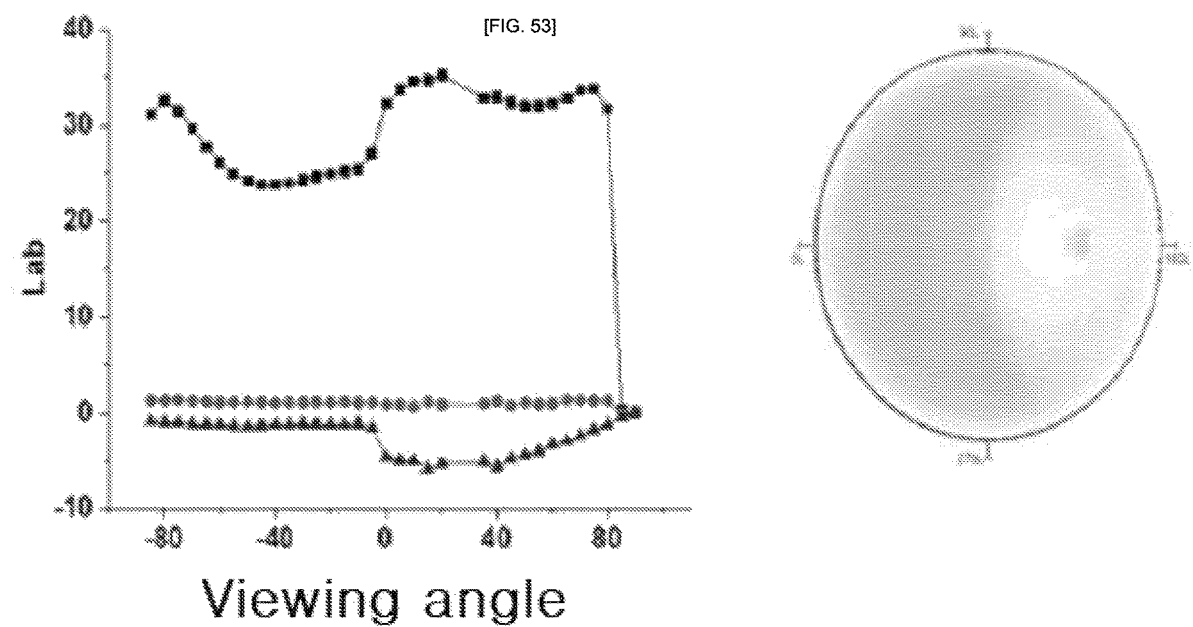
[FIG. 53]
① Shape adjusting Prism 3 L
② Shape adjusting Prism 3 a
③ Shape adjusting Prism 3 b

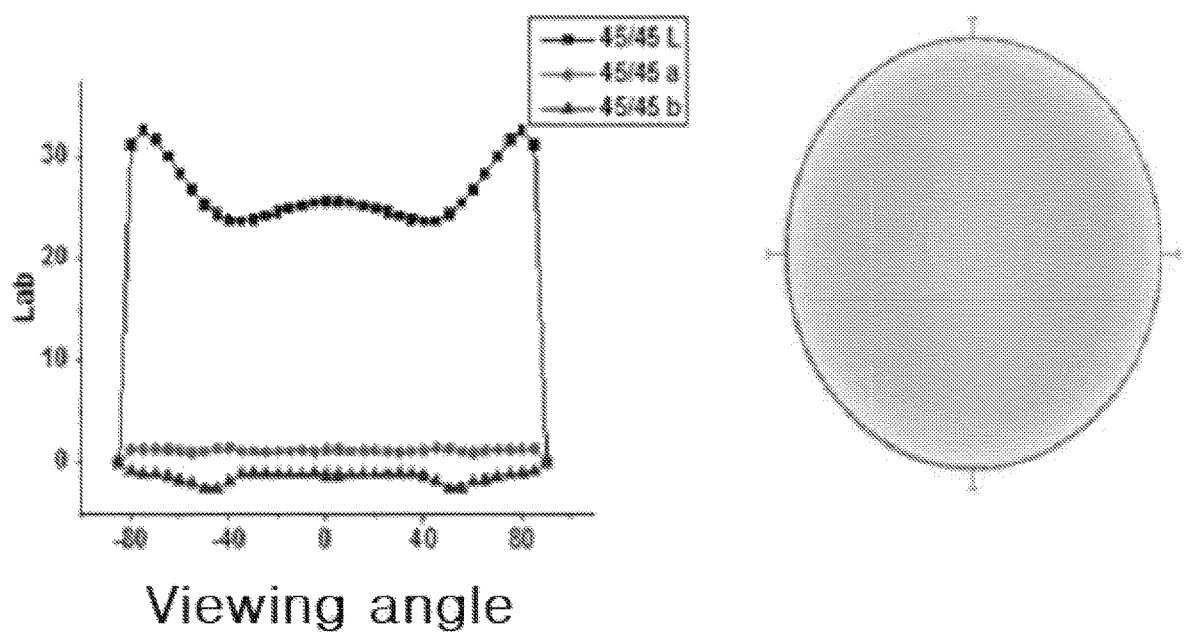
[FIG. 54]

[FIG. 55]
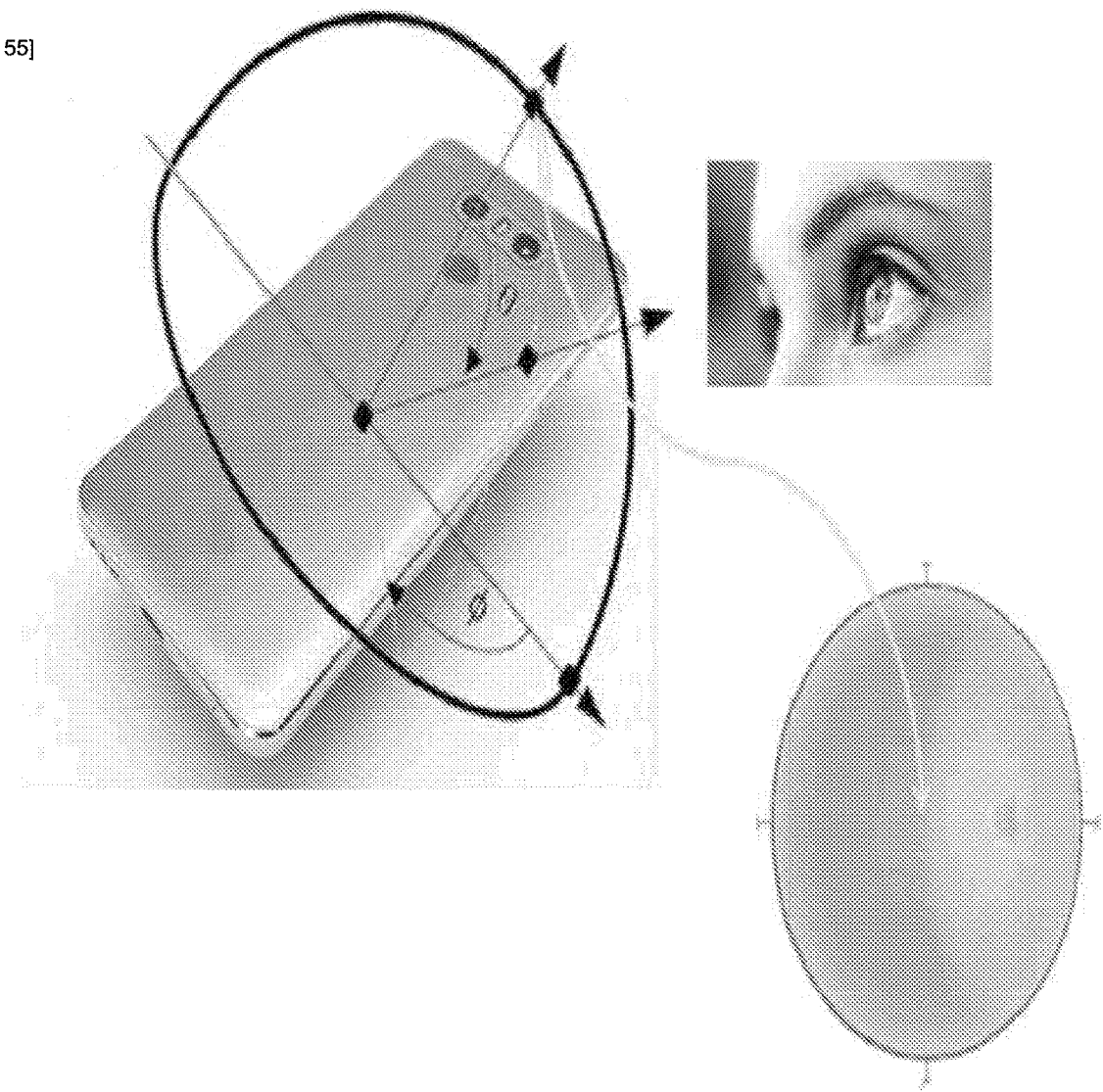

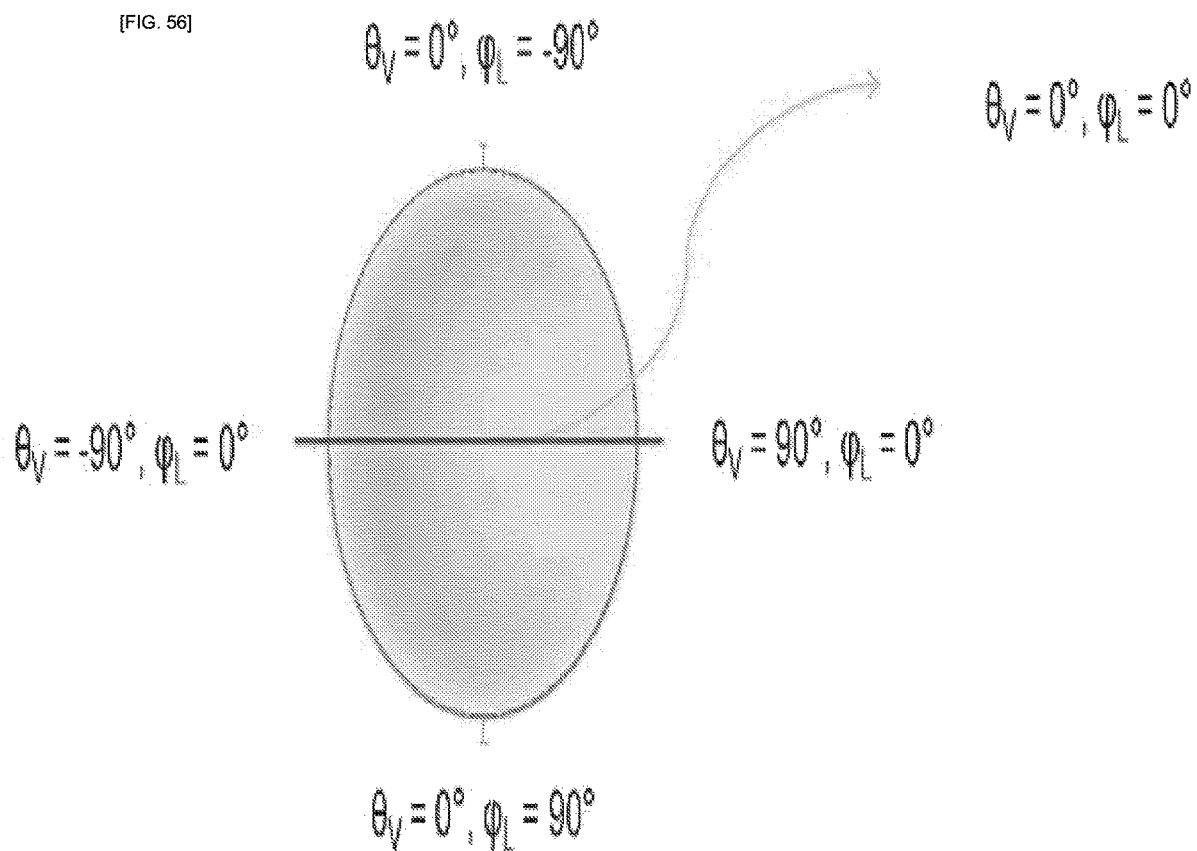
[FIG. 56]

DECORATIVE MEMBER AND METHOD FOR MANUFACTURING DECORATIVE MEMBER

This application is a National Stage Application of International Application No. PCT/KR2018/002671 filed on Mar. 6, 2018, which claims priority to and the benefits of Korean Patent Application No. 10-2017-0028261, filed with the Korean Intellectual Property Office on Mar. 6, 2017, Korean Patent Application No. 10-2017-0136790, filed with the Korean Intellectual Property Office on Oct. 20, 2017, and Korean Patent Application No. 10-2017-0160298, filed with the Korean Intellectual Property Office on Nov. 28, 2017, the entire contents of which are incorporated herein by reference.

TECHNICAL FIELD

The present application relates to a decoration element and a method for preparing a decoration element.

BACKGROUND ART

With the development of information technology (IT), portable electronic devices and electronic goods have become diverse, and upon requests from users having increased interests in designs, interests in the appearances of portable electronic devices and electronic goods have increased.

Patent Document 1 relates to a method for preparing a decoration element for an electronic device using a pattern. Generally, a decoration element using a pattern displays one color, however, interests in a decoration element having dichroism expressing different colors depending on a viewing direction are also growing.

PRIOR ART DOCUMENTS

Patent Documents

Patent Document 1: Korean Patent No. 10-1652875

DISCLOSURE

Technical Problem

The present application is directed to providing a decoration element having dichroism expressing different colors depending on a viewing direction, and having improved visibility of the dichroism, and a method for preparing a decoration element.

Technical Solution

The present application relates to a decoration member. The decoration member according to one embodiment of the present specification comprises a pattern layer comprising a surface having a convex portion or concave portion shape having an asymmetric-structured cross-section; and an inorganic material layer provided on the surface having the convex portion or concave portion shape.

In the present specification, "or" represents, unless defined otherwise, a case of selectively or all comprising those listed, that is, a meaning of "and/or".

In the present specification, a "layer" means covering 70% or more of an area where the corresponding layer is present. Preferably, it means covering 75% or more and more preferably covering 80% or more.

In the present specification, the cross-section means a surface when cutting the convex portion or concave portion in any one direction. For example, the cross-section may mean, when placing the decoration member on the ground, a surface when cutting the convex portion or concave portion in a direction parallel to the ground or a direction perpendicular to the ground. In the surface having the convex portion or concave portion shape of the pattern layer of the decoration member according to the embodiment, at least one of the cross-sections in a direction perpendicular to the ground has an asymmetric structure.

In the present specification, the asymmetric-structured cross-section means a structure in which a figure formed with the borders of the cross-section does not have line symmetry or point symmetry. Line symmetry refers to having a property of overlapping when mirroring a certain figure centering on a straight line. Point symmetry refers to, when a certain figure rotates 180 degrees based on one point, having a symmetrical property completely overlapping the original figure. Herein, the borders of the asymmetric-structured cross-section may be a straight line, a curved line or a combination thereof.

As described above, the decoration member may develop dichroism by the convex portion or concave portion having an asymmetric-structured cross-section included in the surface of the pattern layer. Dichroism means different colors being observed depending on a viewing angle. Colors may be expressed by CIE $L^*a^*b^*$, and a color difference may be defined using a distance ($\Delta E^*ab$) in the $L^*a^*b^*$ space. Specifically, the color difference is $\Delta E^*ab = \sqrt{\{(\Delta L)^2 + (\Delta a)^2 + (\Delta b)^2\}}$, and within a range of $0 < \Delta E^*ab < 1$, an observer may not recognize the color difference [reference document: Machine Graphics and Vision 20(4):383-411]. Accordingly, dichroism may be defined by $\Delta E^*ab > 1$ in the present specification.

According to a preferred embodiment, the surface having the convex portion or concave portion shape comprises two or more of the convex portion or concave portion shapes. By having such a surface with two or more of the convex portion or concave portion shapes, dichroism may become greater. Herein, the two or more convex portion or concave portion shapes may have a form of repeating identical shapes, however, shapes different from each other may be included.

According to one embodiment of the present specification, in the convex portion or concave portion shape having an asymmetric-structured cross-section, at least one cross-section comprises two or more sides having different inclined angles, different curvatures, or different side shapes. For example, when two sides among the sides forming at least one cross-section have different inclined angles, different curvatures, or different side shapes, the convex portion or concave portion has an asymmetric structure.

According to a preferred embodiment of the present specification, in the shape of the convex portion or concave portion, at least one cross-section comprises a first inclined side and a second inclined side having different inclined angles.

In the present specification, unless mentioned otherwise, the "side" may be a straight line, but is not limited thereto, and a part or all may be a curved line. For example, the side may comprise a structure of a part of an arc of a circle or oval, a wave structure or a zigzag.

In the present specification, when the side comprises a part of an arc of a circle or oval, the circle or oval may have a radius of curvature. The radius of curvature may be defined by, when converting an extremely short section of a curved line into an arc, the radius of the arc.

In the present specification, unless mentioned otherwise, the "inclined side" means, when placing the decoration member on the ground, a side having an angle formed by a side with respect to the ground being greater than 0 degrees and less than or equal to 90 degrees. Herein, when the side is a straight line, an angle formed by the straight line and the ground may be measured. When the side comprises a curved line, an angle formed by, when placing the decoration member on the ground, the ground and a straight line connecting a point of the side closest to the ground and a point of the side farthest from the ground in a shortest distance may be measured.

In the present specification, unless mentioned otherwise, the inclined angle is, when placing the decoration member on the ground, formed by the ground and a surface or side forming the pattern layer, and greater than 0 degrees and less than or equal to 90 degrees. Alternatively, it may mean an angle formed by the ground and a segment (a'-b') made when connecting a point (a') where a surface or side forming the pattern layer adjoins the ground and a point (b') where a surface or side forming the pattern layer is farthest from the ground.

In the present specification, unless mentioned otherwise, the curvature means a degree of changes in the slope of the tangent at continuous points of a side or surface. As the change in the slope of the tangent at continuous points of a side or surface is larger, the curvature is high.

An angle (a1) formed by the first inclined side (L1) and the second inclined side (L2) may be in a range of 80 degrees to 100 degrees. Specifically, the angle (a1) may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined side and the second inclined side. When the first inclined side and the second inclined side do not form a vertex with each other, the angle may mean an angle of a vertex in a state forming a vertex by virtually extending the first inclined side and the second inclined side.

A difference between the inclined angle (a2) of the first inclined side and the inclined angle (a3) of the second inclined side may be in a range of 30 degrees to 70 degrees in the convex portion (P1). The difference between the inclined angle (a2) of the first inclined side and the inclined angle (a3) of the second inclined side may be, for example, 30 degrees or greater, 35 degrees or greater, 40 degrees or greater or 45 degrees or greater, and may be 70 degrees or less, 65 degrees or less, 60 degrees or less or 55 degrees or less. Having the difference between the inclined angles of the first inclined side and the second inclined side in the above-mentioned range may be advantageous in terms of obtaining direction-dependent color expression.

According to one embodiment, the convex portion shape or the concave portion shape on the pattern layer surface may be a cone-type convex portion protruded to an outer side of the pattern layer surface or a cone-type concave portion dent to an inner side of the pattern layer surface.

The cone type comprises a shape of a circular cone, an oval cone, or a polypyramid. Herein, the shape of the bottom surface of the polypyramid comprises a triangle, a square, a star shape having 5 or more protruding points, and the like. According to one embodiment, when the pattern layer surface has a cone-type convex portion shape when placing the decoration element on the ground, at least one of the vertical cross-sections with respect to the ground of the convex portion shape may be a triangle shape. According to another embodiment, when the pattern layer surface has a cone-type concave portion shape when placing the decoration element on the ground, at least one of the vertical cross-sections with respect to the ground of the concave portion shape may be an inversed triangle shape.

According to one embodiment, the cone-type convex portion or cone-type concave portion shape may have at least one asymmetric-structured cross-section. For example, when observing the cone-type convex portion or concave portion from a surface side of the convex portion or concave portion shape, the presence of 2 or less of the same shape when rotating 360 degrees based on a vertex of the cone is advantageous in developing dichroism. FIG. 7 illustrates the cone-type convex portion shape observed from a surface side of the convex portion shape, and (a) all illustrates symmetric-structured cone types and (b) all illustrates asymmetric-structured cone types.

When placing the decoration element on the ground, the symmetric-structured cone type has a structure in which a cross-section in a direction horizontal to the ground (hereinafter, referred to as a horizontal cross-section) is circle or a regular polygon having the same side lengths, and the vertex of the cone is present on the line perpendicular to the cross-section of the center of gravity of the horizontal cross-section with respect to the ground. However, the cone type having an asymmetric-structured cross-section has a structure in which, when observing from a surface side of the cone-type convex portion or concave portion shape, the position of the vertex of the cone is present on the vertical line of the point that is not the center of gravity of the horizontal cross-section of the cone, or has a structure in which the horizontal cross-section of the cone is an asymmetric-structured polygon or an oval. When the horizontal cross-section of the cone is an asymmetric-structured polygon, at least one of the sides and the angles of the polygon may be designed to be different from the rest.

For example, as in FIG. 8, the position of the vertex of the cone may be changed. Specifically, when designing the vertex of the cone to be located on the vertical line of the center of gravity (01) of the horizontal cross-section with respect to the ground of the cone when observing from a surface side of the cone-type convex portion shape as in the first drawing of FIG. 8, 4 identical structures may be obtained when rotating 360 degrees based on the vertex of the cone (4-fold symmetry). However, the symmetric structure is broken by designing the vertex of the cone on a position (02) that is not the center of gravity (01) of the horizontal cross-section with respect to the ground. When employing a length of one side of the horizontal cross-section with respect to the ground as x, migration distances of the vertex of the cone as a and b, a height of the cone type, a length of a line virtually connecting from the vertex of the cone (01 or 02) to the horizontal cross-section with respect to the ground, as h, and an angle formed by the horizontal cross-section and a side surface of the cone as θn, cosine values for Surface 1, Surface 2, Surface 3 and Surface 4 of FIG. 8 may be obtained as follows.

$$\cos(\Theta 1) = \frac{\left(\frac{x}{2}\right)}{sqrt\left(h^2 + \left(\frac{x}{2}\right)^2\right)}$$

$$\cos(\Theta 2) = \frac{\left(\frac{x}{2}\right)}{sqrt\left(h^2 + \left(\frac{x}{2}\right)^2\right)}$$

$$\cos(\Theta 3) = \frac{\left(\frac{x}{2} - a\right)}{sqrt\left(h^2 + \left(\frac{x}{2} - a\right)^2\right)}$$

$$\cos(\Theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference between two colors (E*ab), and therefore, dichroism may be obtained. Herein, |θ3−θ4|>0. As above, how much the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

According to another embodiment, the pattern layer has a surface having a convex portion shape in which the highest point has a line shape or concave portion shape in which the lowest point has a line shape. FIG. 10 to FIG. 12 present images of examples obtaining a line-shaped convex portion. The line shape may be a straight-line shape or a curved-line shape, and may comprise both a curve and a straight line or a zigzag shape. When observing the surface having the convex portion shape in which the highest point has a line shape or the concave portion shape in which the lowest point has a line shape from a surface side of the convex portion or concave portion shape, having only one identical shape when rotating 360 degrees based on the center of gravity of the horizontal cross-section with respect to the ground of the convex portion or the concave portion is advantageous in developing dichroism. FIG. 9 illustrates a surface having a convex portion shape in which the highest point has a line shape, and (a) illustrates a pattern having a convex portion developing no dichroism and (b) illustrates a pattern having a convex portion developing dichroism. An X-X' cross-section of FIG. 9(a) is an isosceles triangle or an equilateral triangle, and a Y-Y' cross-section of FIG. 9(b) is a triangle having different side lengths.

According to another embodiment, the pattern layer has a surface having a convex portion or concave portion shape in which a cone-type tip portion is cut. FIG. 13 illustrates images obtaining, when placing a decoration element on the ground, an inversed trapezoidal concave portion in which a cross-section perpendicular to the ground is asymmetric. Such an asymmetric cross-section may have a trapezoidal or inversed trapezoidal shape. In this case, dichroism may also be developed by the asymmetric-structured cross-section.

In addition to the structure illustrated above, various surfaces of convex portion or concave portion shapes as in FIG. 14 may be obtained.

According to one embodiment, the convex portion or concave portion shape comprises a first inclined surface and a second inclined surface having different inclined angles.

In the present specification, unless mentioned otherwise, the "surface" may be a flat surface, but is not limited thereto, and a part or all may be a curved surface. For example, the shape of a cross-section in a direction perpendicular to the surface may comprise a structure of a part of an arc of a circle or oval, a wave structure or a zigzag.

In the present specification, unless mentioned otherwise, the "inclined surface" means, when placing the decoration member on the ground, a surface having an angle formed by a surface with respect to the ground being greater than 0 degrees and less than or equal to 90 degrees. Herein, when the surface is a flat surface, an angle formed by the flat surface and the ground may be measured. When the surface comprises a curved surface, an angle formed by, when placing the decoration member on the ground, the ground and a straight line connecting a point of the surface closest to the ground and a point of the surface farthest from the ground in a shortest distance may be measured.

FIG. 1 to FIG. 3 each illustrate a decoration element comprising a pattern layer comprising a convex portion (P1)-shaped surface, and an inorganic material layer (not shown).

In the present specification, inclined angles (a2, a3) of the convex portion (P1) may mean angles formed by inclined surfaces (S1, S2) of the convex portion (P1) and a horizontal surface of the pattern layer. Unless particularly mentioned otherwise in the present specification, the first inclined surface may be defined as a left inclined surface having the convex portion, and the second inclined surface may mean a right inclined surface having the convex portion in the drawings.

The convex portion (P1) of the pattern layer may have a column shape in which a cross-section is polygonal and extended in one direction. In one embodiment, the cross-section of the convex portion (P1) may be a triangle or may have a shape further comprising a small concave portion on a tip portion (pointed part or vertex part) of the triangle.

An angle (a1) formed by the first inclined surface (S1) and the second inclined surface (S2) may be in a range of 80 degrees to 100 degrees. The angle (a1) may be specifically 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined surface and the second inclined surface. When the first inclined surface and the second inclined surface do not form a vertex with each other, the angle may mean an angle of a vertex in a state forming a vertex by virtually extending the first inclined surface and the second inclined surface.

A difference between the inclined angle (a2) of the first inclined surface and the inclined angle (a3) of the second inclined surface may be in a range of 30 degrees to 70 degrees in the convex portion (P1). The difference between the inclined angle (a2) of the first inclined surface and the inclined angle (a3) of the second inclined surface may be, for example, 30 degrees or greater, 35 degrees or greater, 40 degrees or greater or 45 degrees or greater, and may be 70 degrees or less, 65 degrees or less, 60 degrees or less or 55 degrees or less. Having the difference between the inclined angles of the first inclined surface and the second inclined surface in the above-mentioned range may be advantageous in terms of obtaining direction-dependent color expression.

A height (H1) of the convex portion (P1) may be from 5 μm to 30 μm. Having the convex portion height in the above-mentioned range may be advantageous in a production process aspect. In the present specification, the convex portion height may mean a shortest distance between the highest part and the lowest part of the convex portion based on the horizontal surface of the pattern layer. As for the descriptions relating to the height of the convex portion, the same numerical range may also be used in the depth of the concave portion described above.

A width (W1) of the convex portion (P1) may be from 10 μm to 90 μm. Having the convex portion width in the above-mentioned range may be advantages in a process aspect in processing and forming a pattern. The width of the convex portion (P1) may be, for example, 10 μm or greater, 15 μm or greater, 20 μm or greater or 25 μm or greater, and may be 90 μm or less, 80 μm or less, 70 μm or less, 60 μm or less, 50 μm or less, 40 μm or less or 35 μm or less. The descriptions relating to the width may be used in the concave portion described above as well as the convex portion.

A distance between the convex portions (P1) may be from 0 μm to 20 μm. The distance between the convex portions in the present specification may mean, in two adjacent convex portions, a shortest distance between a point where one convex portion ends and a point where another convex portion starts. When properly maintaining the distance between the convex portions, a phenomenon of a reflection area looking dark due to shading when a relatively bright color is to be obtained may be improved when looking at the decoration element from an inclined surface side of the convex portion having a larger inclined angle. Between the convex portions, a second convex portion with a smaller height compared to the convex portion may be present as to be described later. The descriptions relating to the distance may be used in the concave portion described above as well as the convex portion.

The pattern layer has a flat portion on an opposite side surface of the surface forming the convex portion, and the flat portion may be formed on a substrate layer. As the substrate layer, a plastic substrate may be used. As the plastic substrate, triacetyl cellulose (TAC); cycloolefin copolymers (COP) such as norbornene derivatives; poly(methyl methacrylate (PMMA); polycarbonate (PC); polyethylene (PE); polypropylene (PP); polyvinyl alcohol (PVA); diacetyl cellulose (DAC); polyacrylate (Pac); polyether sulfone (PES); polyetheretherketon (PEEK); polyphenylsulfone (PPS), polyetherimide (PEI); polyethylene naphthatlate (PEN); polyethylene terephtalate (PET); polyimide (PI); polysulfone (PSF); polyarylate (PAR), amorphous fluorine resins or the like may be used, however, the plastic substrate is not limited thereto.

The pattern layer may comprise a curable resin. As the curable resin, photocurable resins or thermocurable resins may be used. As the photocurable resin, ultraviolet curable resins may be used. Examples of the thermocurable resin may comprise silicone resins, silicon resins, furan resins, polyurethane resins, epoxy resins, amino resins, phenol resins, urea resins, polyester resins, melamine resins or the like, but are not limited thereto. Typical examples of the ultraviolet curable resin may comprise acrylic polymers such as polyester acrylate polymers, polystyrene acrylate polymers, epoxy acrylate polymers, polyurethane acrylate polymers or polybutadiene acrylate polymers, silicone acrylate polymers, alkyl acrylate polymers or the like, but are not limited thereto.

The pattern layer may be prepared by coating a curable resin composition on a substrate layer, compressing the result to a mold having a target pattern, and then curing the result. The mold may have, for example, a plate shape or a roll shape. As an example of the mold, a soft mold or a hard mold may be used.

A color dye may be further included inside or on at least one surface of the pattern layer. Comprising a color dye on at least one surface of the pattern layer may, for example, mean a case of comprising a color dye in the substrate layer described above provided on a flat portion side of the pattern layer.

As the color dye, anthraquinone-based dyes, phthalocyanine-based dyes, thioindigo-based dyes, perinone-based dyes, isoxindigo-based dyes, methane-based dyes, monoazo-based dyes, 1:2 metal complex-based dyes and the like may be used.

When comprising the color dye inside the pattern layer, the dye may be added to the curable resin to be used. When further comprising the color dye below the pattern layer, a method of coating a layer comprising the dye above or below the substrate layer may be used.

The color dye content may be, for example, from 0 wt % to 50 wt %. The color dye content may determine transmittance and haze ranges of the pattern layer or the decoration element, and the transmittance may be, for example, from 20% to 90%, and the haze may be, for example, from 1% to 40%.

The inorganic material layer may give metal texture and depth of color when looking at the decoration element. The inorganic material layer allows an image of the decoration element to be seen in various colors depending on the viewing angle. This is due to the fact that the wavelength of light passing the pattern layer and reflected on the inorganic material layer surface changes depending on the wavelength of incident light.

The inorganic material layer may have the same convex portion or concave portion as the surface of the pattern layer described above. The inorganic material layer may have the same slope as the surface of the pattern layer described above. The inorganic material layer may comprise a metal.

Examples of the inorganic material layer may comprise one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites. The inorganic material layer may be a single layer or a multilayer comprising the material.

The inorganic material layer may have a refractive index of 0 to 8 for light having a 400 nm wavelength. The refractive index of the inorganic material layer being outside the above-mentioned range may not be proper since it becomes dark due to reduced reflected light. Specifically, the refractive index of the inorganic material layer may be 0 or greater, 1 or greater, 2 or greater, 3 or greater, 4 or greater or 4.5 or greater, and may be 8 or less, 7 or less, 6 or less or 6.5 or less.

The thickness of the inorganic material layer may be, for example, from 10 nm to 1 μm. The inorganic material layer having a thickness in the above-mentioned range may be advantageous in providing a decoration element having dichroism expressing different colors depending on a viewing direction and having improved visibility of the dichroism. The thickness of the inorganic material layer may be, for example, 10 nm or greater, 50 nm or greater or 100 nm or greater, and may be 1 μm or less, 800 nm or less, 600 nm or less, 400 nm or less or 300 nm or less. The decoration element may have dichroism expressing different colors depending on a viewing direction. The decoration element may improve visibility of the dichroism by transforming a surface shape of the pattern layer.

In the present specification, a "thickness" of a certain layer means a shortest distance from a lower surface to an upper surface of the corresponding layer.

FIG. 1 illustrates a decoration element comprising a pattern layer according to a $1^{st}$ example of the present specification. According to the $1^{st}$ example of the present specification, the pattern layer surface may have a plurality of the convex portions a second convex portion (P2) having a smaller height compared to the convex portion between the adjacent convex portions (P1). Hereinafter, the convex portion stated prior to the second convex portion may be referred to as a first convex portion.

A height (H2) of the second convex portion (P2) may be in a range of ⅕ to ¼ of the height (H1) of the first convex portion (P1). For example, a height difference (H1–H2) between the first convex portion and the second convex portion may be from 10 μm to 30 μm. A width (W2) of the second convex portion may be from 1 μm to 10 μm. Specifically, the width (W2) of the second convex portion may be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

The second convex portion may have two inclined surfaces (S3, S4) having different inclined angles. An angle (a4) formed by the two inclined surfaces of the second convex portion may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a6–a5) between both inclined surfaces of the second convex portion may be from 0 degrees to 60 degrees. The inclined angle difference (a6–a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion having a dimension in the above-mentioned range may be advantageous in terms of forming bright color by increasing light inflow from a side surface having a large inclined surface angle.

FIG. 2 illustrates a decoration element comprising a pattern layer according to a $2^{nd}$ example of the present specification. According to the $2^{nd}$ example of the present specification, the pattern layer surface may have a shape further comprising a concave portion (P3) having a smaller height compared to the convex portion on a tip portion (pointed part) of the convex portion (P1). Such a decoration element may exhibit an effect of an image color softly changing depending on a viewing angle.

A height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different inclined angles. An angle (a7) formed by the two inclined surfaces of the concave portion may be from 20 degrees to 100 degrees. Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a9–a8) between both inclined surfaces of the concave portion may be from 0 degrees to 60 degrees. The inclined angle difference (a9–a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms that a color sense may be added on the inclined surface.

FIG. 3 illustrates a decoration element comprising a pattern layer according to a $3^{rd}$ example of the present specification. According to the $3^{rd}$ example of the present specification, as illustrated in FIG. 3(a), the pattern layer surface may have a shape of a plurality of convex portions being arranged in an inversed phase structure of 180 degrees. Specifically, the pattern layer surface may comprise a first area (C1) in which the second inclined surface has a larger inclined angle compared to the first inclined surface, and a second area (C2) in which the second inclined surface has a larger inclined angle compared to the first inclined surface. In one example, the convex portion included in the first area may be referred to as a first convex portion (P1), and the convex portion included in the second area may be referred to as a fourth a convex portion (P4). As for heights, widths, inclined angles and an angle formed by the first and the second inclined surfaces of the first convex portion (P1) and the fourth convex portion (P4), descriptions provided in the convex portion (P1) section may be used in the same manner. As illustrated in FIG. 3(b), it may be constituted that any one area of the first area and the second area corresponds to an image or a logo, and the other area corresponds to a background part. Such a decoration element may exhibit an effect of an image or logo color softly changing depending on a viewing angle. In addition, a decorative effect of colors of an image or logo part and a background part looking switched depending on a viewing direction.

The first area and the second area may each comprise a plurality of convex portions. Widths and the number of convex portions of the first area and the second area may be properly controlled depending on the size of a target image or logo.

FIG. 32 illustrates a decoration member comprising a pattern layer according to a 4th example of the present specification. According to the 4th example of the present specification, the cross-section of the pattern layer has a convex portion shape, and the cross-section of the convex portion shape comprises a first area (D1) comprising a first inclined side and a second area (D2) comprising a second inclined side. The first inclined side and the second inclined side have a straight-line shape. An angle (c3) formed by the first inclined side and the second inclined side may be from 75 degrees to 105 degrees. An angle (c1) formed by the first inclined side and the ground and an angle (C2) formed by the second inclined side and the ground are different. For example, a combination of c1 and c2 may be 20 degrees/80 degrees, 10 degrees/70 degrees or 30 degrees/70 degrees.

FIG. 33 illustrates a decoration member comprising a pattern layer according to a 5th example of the present specification. According to the 5th example of the present specification, the cross-section of the pattern layer has a convex portion shape, and the cross-section of the convex portion shape comprises a first area (E1) comprising a first inclined side and a second area (E2) comprising a second inclined side. Any one or more of the first inclined side and the second inclined side may have a curved-line shape. For example, the first inclined side and the second inclined side may both have a curved-line shape, or the first inclined side may have a straight-line shape, and the second inclined side may have a curved-line shape. When the first inclined side has a straight-line shape and the second inclined side has a curved-line shape, the angle c1 may be larger than the angle c2. FIG. 33 illustrates the first inclined side having a straight-line shape and the second inclined side having a curved-line shape. The angle formed by the inclined side having a curved-line shape with the ground may be calculated from, when drawing an arbitrary straight line from a point where the inclined side touching the ground to a point where the first inclined side adjoins the second inclined side, an angle formed by the straight line and the ground. The curved-line-shaped second inclined side may have a different curvature depending on the pattern layer height, and the curved line may have a radius of curvature. The radius of curvature may be 10 times or less than the pitch (E1+E2) of the convex portion shape. FIG. 33(a) shows a radius of curvature of the curved line being twice the pitch of the convex portion shape, and FIG. 33(b) shows a radius of curvature of the curved line being the same as the pitch of the convex portion shape. A ratio of the part (E2) having a curvature with respect to the pitch (E1+E2) of the convex portion may be 90% or less. FIGS. 33(a) and (b) illustrate a ratio of the part (E2) having a curvature with respect to the pitch (E1+E2) of the convex portion being 60%.

FIG. 34 illustrates a decoration member comprising a pattern layer according to a 6th example of the present specification. According to the 6th example of the present specification, the cross-section of the pattern layer has a convex portion shape, and the cross-section of the convex portion shape may be a square shape. The square shape may be a general square shape, and is not particularly limited as long as an inclined angle of each inclined side is different. The square shape may be a shape left after partially cutting a triangle. For example, a trapezoid in which one pair of opposite sides is parallel, or a square shape in which a pair of opposite sides parallel to each other is not present may be included. The cross-section of the convex portion shape comprises a first area (F1) comprising a first inclined side, a second area (F2) comprising a second inclined side and a third area (F3) comprising a third inclined side. The third inclined side may or may not be parallel to the ground. For example, when the square shape is a trapezoid, the third inclined side is parallel to the ground. Any one or more of the first inclined side to the third inclined side may have a curved-line shape, and details on the curved-line shape are the same as the descriptions provided in the 5th example. The combined length of F1+F2+F3 may be defined as a pitch of the convex portion pattern, and details on the pitch are the same as the descriptions provided above.

FIG. 35 illustrates a decoration member comprising a pattern layer according to a 7th example of the present specification. According to the 7th example of the present specification, a flat portion may be included between each convex portion of the pattern layer. The flat portion means an area where a convex portion is not present. Other than the pattern layer further comprising a flat portion, descriptions on the remaining constituents (D1, D2, c1, c2, c3, first inclined side and second inclined side) are the same as the descriptions provided in the 4th example. A constitution (D1+D2+G1) comprising any one convex portion and one flat portion adjoining the convex portion may be referred to as a unit pattern. A ratio of the convex portion area (D1+D2) with respect to the unit pattern area (D1+D2+G1) may be greater than or equal to 10% and less than or equal to 100%. In FIG. 35(a), the ratio is 83%, and in FIG. 35(b), the ratio is 50%.

FIG. 36 illustrates a pattern layer of a decoration member according to an 8th example of the present specification, and a method for preparing the same. According to the 8th example of the present specification, the cross-section of the pattern layer has a convex portion shape, and the cross-section of the convex portion shape may have a shape removing a specific area of the ABO1 triangle shape. A method of defining the removed specific area is as follows. Details on the inclined angles c1 and c2 are the same as the descriptions provided above.

1) An arbitrary point P1 on an AO1 segment dividing the AO1 segment in a ratio of L1:L2 is set.

2) An arbitrary point P2 on a BO1 segment dividing the BO1 segment in a ratio of m1:m2 is set.

3) An arbitrary point O2 on an AB segment dividing the AB segment in a ratio of n1:n2 is set.

4) An arbitrary point P3 on an O1O2 segment dividing the O2O1 segment in a ratio of o1:o2 is set.

Herein, the ratios of L1:L2, m1:m2, n1:n2 and o1:o2 are the same as or different from each other, and may be each independently from 1:1000 to 1000:1.

5) The area formed by the P1O1P2P3 polygon is removed.

6) The shape formed by the ABP2P3P1 polygon is employed as the cross-section of the convex portion.

The pattern layer according to the 8th example may be modified to various forms by adjusting the ratios of L1:L2, m1:m2, n1:n2 and o1:o2. For example, the height of the pattern may increase when the L1 and m1 increase, and the height of the concave portion formed on the convex portion may decrease when the o1 increases, and by adjusting the ratio of n1, the position of the lowest point of the concave portion formed on the convex portion may be adjusted to be closer to any one side of the inclined sides of the convex portion.

FIG. 37 illustrates a pattern layer of a decoration member according to an 8-$1^{st}$ example of the present specification. When the ratios of L1:L2, m1:m2 and o1:o2 are all the same, the cross-section shape may be a trapezoidal shape. The height of the trapezoid (ha, hb) may vary by adjusting the ratio of L1:L2. For example, FIG. 37(a) illustrates a pattern layer prepared when the L1:L2 ratio is 1:1, and FIG. 37(b) illustrates a pattern layer prepared when the L1:L2 ratio is 2:1.

FIG. 38 illustrates a pattern layer of a decoration member according to an 8-$2^{nd}$ example of the present specification. It illustrates a pattern layer prepared when the 11:12 ratio is 1:2, the m1:m2 ratio is 1:1, the n1:n2 ratio is 1:5, and the o1:o2 ratio is 1:1.

FIG. 39(a) illustrates a pattern layer of a decoration member according to an 8-$3^{rd}$ example of the present specification. It illustrates that, in the 8th example, the o1:o2 ratio is greater than 1:1 and less than or equal to 1000:1, and the P1P3 and P2P3 segments are curved lines instead of straight lines. The P1P3 and P2P3 segments are connected with one curved line, and may have a certain radius of curvature. Details on the radius of curvature are the same as described above.

FIG. 39(b) illustrates a pattern layer of a decoration member according to an 8-$4^{th}$ example of the present specification. It illustrates that, in the 8th example, the o1:o2 ratio is greater than 1:1 and less than or equal to 1000:1, and the P1P3 and P2P3 segments are curved lines instead of straight lines. The P1P3 and P2P3 segments are connected with one curved line, and may have a certain radius of curvature. Details on the radius of curvature are the same as described above.

FIG. 40 illustrates a pattern layer of a decoration member according to an 8-$5^{th}$ example of the present specification. It illustrates, in the 8th example, a pattern layer prepared when the L1:L2 ratio is 2:1, the m1:m2 ratio is 1:1, and the o1:o2 ratio is 1:8.

In the present application, the light absorbing layer and the light reflective layer are named by the function. For light having a specific wavelength, a layer reflecting light relatively more may be expressed as the light reflective layer, and a layer reflecting light relatively less may be expressed as the light absorbing layer.

Through FIG. 41, the light absorbing layer and the light reflective layer are described. In the decoration element of FIG. 41, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 2]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is as described above.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda} \quad \text{[Mathematical Equation 2]}$$

Herein, when $R_i$ of $I_i$ is the largest among the interfaces of a laminate, a layer located adjoining the interface $I_i$, and facing the interface $I_i$ in a light entering direction may be defined as the light reflective layer, and the remaining layers may be defined as the light absorbing layer. For example, in the laminate illustrated in FIG. 41, when a sum of reflectance for each wavelength at the interface $I_{i+1}$ is the largest, the $L_{i+1}$ layer located adjoining the $I_{i+1}$, and facing the interface $I_{i+1}$ in a light entering direction may be defined as the light reflective layer, and the remaining $L_{i-1}$ layer and $L_i$ layer may be defined as the light absorbing layer.

The present application also relates to a method for preparing a decoration element. FIG. 4 illustrates a method for preparing a decoration element of the present specification. The illustrative preparation method comprises preparing a pattern layer comprising a surface having a convex portion or concave portion shape having an asymmetric-structured cross-section; and forming an inorganic material layer on the surface having the convex portion or concave portion shape having an asymmetric-structured cross-section of the pattern layer.

As one embodiment, the preparation method may comprise, in a pattern layer comprising a convex portion-shaped surface comprising first and second inclined surfaces having different inclined angles, depositing first and second inorganic material layers on the first and the second inclined surfaces, respectively.

The illustrative preparation method deposits each of the inorganic material layers on the two inclined surfaces of the pattern layer, and therefore, a thickness and a type of the inorganic material layer on each of the inclined surfaces may be controlled, and therefore, a spectrum of dichroism may be widened. Unless particularly described otherwise in the preparation method, descriptions provided in the decoration element section may be used in the same manner.

The first and the second inorganic material layers may be formed on the top of the first and the second inclined surfaces, respectively, using a sputter method, an evaporation method, a vapor deposition method, a chemical vapor deposition (CVD) method, wet coating and the like. Particularly, the sputter method has straightness, and therefore, a difference in the deposition thicknesses of both inclined surfaces of the convex portion may be maximized by tilting a position of a target.

In one embodiment, of the first and the second inclined surfaces of the pattern layer (10), the first inorganic material layer (201) may be deposited after tilting toward the inclined surface having a smaller inclined angle (S1), and then the second inorganic material layer (202) may be deposited after tilting toward the inclined surface having a larger inclined angle (S2). Such a process order (S1 and S2) may be reversed, and the process may be advantageous in terms that inorganic materials having different thicknesses may be deposited on both inclined surfaces.

The first and the second inorganic material layers may be deposited on the top of the first and the second inclined surfaces to different thicknesses. The thicknesses of the first and the second inorganic material layers may each be properly controlled within the range described in the decoration element section depending on target visual properties.

The first and the second inorganic material layers may be deposited on the top of the first and the second inclined surfaces using different materials. The materials of the first and the second inorganic material layers may each be properly controlled considering target visual properties in the materials in the decoration element section.

The inorganic material layer may be formed in a single layer, or may also be formed in a multilayer of two or more layers.

According to one embodiment, the inorganic material layer may comprise a third inorganic material layer and a fourth inorganic material layer consecutively laminated on the surface having the convex portion or concave portion shape. According to another embodiment, the inorganic material layer may comprise a fourth inorganic material layer and a third inorganic material layer consecutively laminated on the surface having the convex portion or concave portion shape. Materials included in each other may be the same as or different from each other. In addition, materials of the third and the fourth inorganic material layers may comprise the materials of the inorganic material layer described above. The third inorganic material layer may be expressed as a light absorbing layer, and the fourth inorganic material layer may be expressed as a light reflective layer. For example, the inorganic material layer may comprise a light absorbing layer and a light reflective layer consecutively laminated on the surface having the convex portion or concave portion shape, or the inorganic material layer may comprise a light reflective layer and a light absorbing layer consecutively laminated on the surface having the convex portion or concave portion shape.

In the present specification, a light absorbing layer and a light reflective layer are layers having properties relative to each other, and the light absorbing layer may mean a layer having high light absorbance compared to the light reflective layer, and the light reflective layer may mean a layer having high light reflectance compared to the light absorbing layer.

The light absorbing layer and the light reflective layer may each be formed in a single layer, or may also be formed in a multilayer of two or more layers.

In the light absorbing layer, light absorption occurs in an incident path and a reflection path of light, and in addition thereto, lights each reflect on a surface of the light absorbing layer and on an interface between the light absorbing layer and the light reflective layer, and the two reflected lights go through constructive or destructive interference. In the present specification, the light reflected on a surface of the light absorbing layer may be expressed as surface reflected light, and the light reflected on an interface between the light absorbing layer and the light reflective layer may be expressed as interface reflected light. FIG. 15 is a mimetic diagram illustrating such a working principle. FIG. 15 illustrates a structure in which a substrate (101), a light reflective layer (201) and a light absorbing layer (301) are consecutively laminated, and although the substrate is located below the light reflective layer, the structure is not mandatory.

The light reflected on a surface of the light absorbing layer may be expressed as surface reflected light, and the light reflected on an interface between the light absorbing layer and the light reflective layer may be expressed as interface reflected light.

FIG. 6 illustrates a decoration element comprising a pattern layer according to one example of the present specification. According to one example of the present specification, as illustrated in FIG. 6, a decoration element in which the inorganic material layer has a multilayer structure is presented. Specifically, a light absorbing layer (401) and a light reflective layer (501) consecutively formed on the surface having the convex portion shape of the pattern layer may be included. Herein, t1, a thickness of the light reflective layer in area E of the pattern layer comprising the first inclined surface, and t2, a thickness of the light reflective layer in area F of the pattern layer comprising the second inclined surface, may be the same as or different from each other. FIG. 6 relates to a light absorbing layer having inclined surfaces facing each other, that is, cross-sections, being a triangle structure. In the structure of the pattern having inclined surfaces facing each other as in FIG. 6, thicknesses of the light absorbing layer may be different in two surfaces of the triangle structure even when progressing deposition under the same condition. Accordingly, a light absorbing layer having two or more areas with different thicknesses may be formed using just one process. As a result, developed colors may become different depending on the thickness of the light absorbing layer. Herein, the thickness of the light reflective layer does not affect changes in the color when it is a certain thickness or greater.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by $\sin\theta 1/\sin\theta 2$ ($\theta 1$ is an angle of light incident on a surface of the light absorbing layer, and $\theta 2$ is a refraction angle inside the light absorbing layer).

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is $-(1/4pI)(dI/dx)$ (herein, a value multiplying 1/4p with dI/I, a reduced fraction of light intensity per a path unit length (dx), for example 1 m, in the light absorbing layer, and herein, l is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1. The extinction coefficient (k) is in the above-mentioned range at 400 nm, preferably in the whole visible wavelength region of 380 to 780 nm, and therefore, a role of a light absorbing layer may be performed in the visible range.

Even when having the same refractive index (n) value, a difference of $\Delta E^*ab=\sqrt{\{(\Delta L)^2+(\Delta a)^2+(\Delta b)^2\}}>1$ may be obtained when the extinction coefficient (k) value is 0 and when the extinction coefficient (k) value is 0.01 at 380 nm to 780 nm. For example, when simulating a case of irradiating D65 (solar spectrum) as a light source on a lamination structure of glass/aluminum/aluminum oxide/air layer, E*ab values when the k values of the aluminum oxide are 0 and 0.01 are obtained as in the following Table 1. Herein, the thickness (h1) of the aluminum layer is 120 nm, and the thickness (h2) of the aluminum oxide layer is described in the following Table 1. The k values are arbitrarily set at 0 and 0.01 for the simulation, and as the n value, the value of aluminum is used.

TABLE 1

| | k = 0 | | | k = 0.01 | | | |
|---|---|---|---|---|---|---|---|
| h2 [nm] | L | a | b | L | a | b | ΔE*ab |
| 40 | 6.63 | 1.75 | −1.25 | 85.18 | 2.09 | 0.03 | 1.96 |
| 60 | 9.83 | −4.02 | −8.30 | 87.86 | −4.06 | −9.01 | 2.10 |
| 80 | 5.60 | −1.87 | −2.58 | 94.44 | −2.05 | −2.86 | 1.20 |

According to one embodiment, the light reflective layer may be a metal layer, a metal oxynitride layer or an inorganic material layer. The light reflective layer may be formed in a single layer, or may be formed in a multilayer of two or more layers. As one example, the light reflective layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites. For example, the light reflective layer may comprise two or more alloys selected from among the above-mentioned materials, or oxides, nitrides or oxynitrides thereof. For example, the light reflective layer may comprise two or more alloys selected from among the above-mentioned metals. More specifically, the light reflective layer may comprise molybdenum, aluminum or copper. According to another embodiment, the light reflective layer may allow highly resistant reflective layer by being prepared using an ink comprising carbon or carbon composite. Carbon black, CNT and the like may be included as the carbon or carbon composite. The ink comprising carbon or carbon composite may comprise above-described materials, or oxides, nitrides or oxynitrides thereof, and for example, one, two or more types of oxides selected from among indium (In), titanium (Ti), tin (Sn), silicon (Si), germanium (Ge). aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composite. When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to one embodiment, the light absorbing layer may be a single layer, or a multilayer of two or more layers. The light absorbing layer may be formed with materials having an extinction coefficient (k) at 380 nm to 780 nm, that is, materials having an extinction coefficient of greater than 0 and less than or equal to 4, and preferably 0.01 to 4. For example, the light absorbing layer may comprise one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

For example, the light absorbing layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof. As specific examples, the light absorbing layer comprises one, two or more types selected from among copper oxides, copper nitrides, copper oxynitrides, aluminum oxides, aluminum nitrides, aluminum oxynitrides and molybdenum titanium oxynitrides.

According to one embodiment, the light absorbing layer comprises silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to one embodiment, the light absorbing layer is AlOxNy (x>0, y>0).

According to another embodiment, the light absorbing layer may be AlOxNy (0≤x≤1.5, 0≤y≤1).

According to another embodiment, the light absorbing layer is AlOxNy (x>0, y>0), and with respect to the total atom number 100%, the number of each atom satisfies the following equation.

$$1 < \frac{(Al)at \times 3}{(O)at \times 2 + (N)at \times 3} < 2$$

According to one embodiment, the light absorbing layer may be formed with materials having an extinction coefficient (k) at 400 nm, preferably at 380 to 780 nm, and for example, the light absorbing layer/light reflective layer may be formed with materials such as CuO/Cu, CuON/Cu, CuON/Al, AlON/Al, AlN/AL/AlON/Cu or AlN/Cu.

According to one embodiment, the thickness of the light reflective layer may be determined depending on target color in a final structure, and for example, may be 1 nm or greater, preferably 25 nm or greater, for example, 50 nm or greater, and preferably 70 nm or greater.

According to one embodiment, the thickness of the light absorbing layer may be from 5 nm to 500 nm, for example, from 30 nm to 500 nm.

A decoration member according to another embodiment of the present application may further comprise a color film provided between the pattern layer and the inorganic material layer; on a surface opposite to the surface facing the inorganic material layer of the pattern layer; or on a surface opposite to the surface facing the pattern layer of the inorganic material layer.

According to another embodiment of the present application, the inorganic material layer comprises a light absorbing layer and a light reflective layer, and a color film provided between the pattern layer and the inorganic material layer; between the light absorbing layer and the light reflective layer; on a surface opposite to the surface facing the inorganic material layer of the pattern layer; or on a surface opposite to the surface facing the pattern layer of the inorganic material layer is further included.

The color film is not particularly limited as long as a color difference ΔE*ab, a distance in L*a*b* space in a color coordinate CIE L*a*b* of the color developing layer, is greater than 1 when the color film is present compared to when the color film is not provided.

Colors may be expressed by CIE L*a*b*, and the color difference may be defined using a distance (ΔE*ab) in the L*a*b* space. Specifically, the color difference is ΔE*ab=√{(ΔL)²+(Δa)²+(Δb)²}, and within a range of 0<ΔE*ab<1, an observer may not recognize the color difference [reference document: Machine Graphics and Vision 20(4):383-411]. Accordingly, the color difference obtained by the color film addition may be defined by ΔE*ab>1 in the present specification.

By further providing such a color film, the width of colors that may be obtained may be more greatly increased even when materials and thicknesses of the inorganic material layer such as a light reflective layer and a light absorbing layer are determined. The width of color changes obtained by the color film addition may be defined by a color difference (ΔE*ab), a difference in L*a*b* before and after using the color film.

FIG. 22 illustrates a disposed location of a color film. (However, a convex portion or concave portion shape on a pattern layer (101) surface is not included.)

FIG. 22(*a*) illustrates a structure having a color film (401) provided on a surface opposite to a light reflective layer (201) side of a light absorbing layer (301), FIG. 22(*b*) illustrates a structure having a color film (401) provided between a light absorbing layer (301) and a light reflective layer (201), FIG. 22(*c*) illustrates a structure having a color film (401) provided between a light reflective layer (201) and a pattern layer (101), and FIG. 22(*d*) illustrates a structure having a color film (401) provided on a surface opposite to a light reflective layer (201) side of a pattern layer (101). FIG. 22(*e*) illustrates a structure having color films (401*a*, 401*b*, 401*c*, 401*d*) each provided on a surface opposite to a light reflective layer (201) side of a light absorbing layer (301), between the light absorbing layer (301) and the light reflective layer (201), between the light reflective layer (201) and a pattern layer (101), and on a surface opposite to the light reflective layer (201) side of the pattern layer (101), however, the structure is not limited thereto, and 1 to 3 of the color films (401*a*, 401*b*, 401*c*, 401*d*) may not be included.

According to another embodiment of the present specification, a disposed location of a color film in a structure having a light reflective layer (301) and a light absorbing layer (201) consecutively provided on a pattern layer (101) is illustrated in FIG. 23 (a convex portion or concave portion shape on a pattern layer (101) surface is not included).

FIG. 23(*a*) illustrates a structure having a color film (401) provided on a surface opposite to a light absorbing layer (301) side of a pattern layer (101), FIG. 23(*b*) illustrates a structure having a color film (401) provided between a pattern layer (101) and a light absorbing layer (301), FIG. 23(*c*) illustrates a structure having a color film (401) provided between a light absorbing layer (301) and a light reflective layer (201), and FIG. 23(*d*) illustrates a structure having a color film (401) provided on a surface opposite to a light absorbing layer (301) side of a light reflective layer (201). FIG. 23(*e*) illustrates a structure having color films (401*a*, 401*b*, 401*c*, 401*d*) each provided on a surface opposite to a light absorbing layer (301) side of a pattern layer (101), between the pattern layer (101) and the light absorbing layer (301), between the light absorbing layer (301) and a light reflective layer (201), and on a surface opposite to the light absorbing layer (301) side of the light reflective layer (201), however, the structure is not limited thereto, and 1 to 3 of the color films (401*a*, 401*b*, 401*c*, 401*d*) may not be included.

When visible light transmittance of the color film is greater than 0% in structures such as FIG. 22 (*b*) and FIG. 23 (*c*), the light reflective layer may reflect light entering after passing through the color film, and therefore, colors may be obtained from the lamination of the light absorbing layer and the light reflective layer.

In structures such as FIG. 22 (*c*), FIG. 22 (*d*) and FIG. 23 (*d*), light transmittance of the color developed from the color film of the light reflective layer (201) may be 1% or greater, preferably 3% or greater, and more preferably 5% or greater so that changes in the color difference obtained by the color film addition is recognized. This is due to the fact that light transmitted in such a visible light transmittance range that may be mixed with colors by the color film.

The color film may be provided as one sheet, or as a laminate of 2 sheets that are the same or different types.

As the color film, those capable of developing target colors by combining with colors developed from the lamination structure of the light reflective layer and the light absorbing layer described above may be used. For example, color films expressing colors by one, two or more types of pigments and dyes being dispersed into a matrix resin may be used. Such a color film may be formed by directly coating a composition for forming a color film on a color film-providable location as in FIG. 1 to FIG. 3, or a method of preparing a color film by coating a composition for forming a color film on a separate substrate or using a known molding method such as casting or extrusion, and then disposing or attaching the color film on a color film-providable location as in FIG. 1 to FIG. 3 may be used. As the coating method, wet coating or dry coating may be used.

The pigment and the dye capable of being included in the color film may be selected from among those capable of obtaining target colors from a final decoration member, and known in the art, and one, two or more types among pigments and dyes such as red-based, yellow-based, purple-based, blue-based or pink-based may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing a decoration member than the light reflective layer or the light absorbing layer as in, for example, the structures of FIGS. 22(*a*) and (*b*), and FIGS. 23(*a*), (*b*) and (*c*), light transmittance of the colors developed by the color film from the light reflective layer, the light absorbing layer or the lamination structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the lamination structure thereof.

The thickness of the color film is not particularly limited, and those skilled in the art may select and set the thickness as long as it is capable of obtaining target colors. For example, the color film may have a thickness of 500 nm to 1 mm.

The illustrative decoration element and the illustrative method for preparing a decoration element may be used in known subjects requiring the use of a decoration element. For example, they may be used without limit in portable electronic devices, electronic goods, cosmetic containers, furniture, building materials and the like.

A method of using the decoration element in portable electronic devices, electronic goods, cosmetic containers, furniture, building materials and the like is not particularly limited, and known methods known as a method of using a deco film in the art may be used. The decoration member may further comprise a gluing layer as necessary. In another example, the decoration element may be used in portable electronic devices or electronic goods by direct coating. In this case, a separate gluing layer for attaching the decoration element to the portable electronic devices or the electronic goods may not be required. In another example, the decoration element may be attached to portable electronic devices or electronic goods using a gluing layer as a medium. As the gluing layer, an optically clear adhesive tape (OCA tape) or an adhesive resin may be used. As the OCA tape or the adhesive resin, OCA tapes or adhesive resins known in the art may be used without limit. As necessary, a peel-off layer (release liner) may be further provided for protecting the gluing layer.

The present specification provides a method for preparing the above-described decoration member comprising preparing a pattern layer comprising a surface having a convex portion or concave portion shape having an asymmetric-structured cross-section; and forming an inorganic material layer on the surface having the convex portion or concave portion shape having an asymmetric-structured cross-section of the pattern layer.

Advantageous Effects

The present application provides a decoration element having dichroism expressing different colors depending on a viewing direction, and having improved visibility of the dichroism, and a method for preparing a decoration element.

DESCRIPTION OF DRAWINGS

FIG. 1 illustrates a decoration element of the present specification.

FIG. 2 illustrates a decoration element of the present specification.

FIG. 3 illustrates a decoration element of the present specification, and left and right views.

FIG. 4 illustrates a method for preparing a decoration element of the present specification.

FIG. 5 shows a visual evaluation result of dichroism of Example 1.

FIG. 6 illustrates a lamination structure of a decoration element according to one embodiment of the present specification.

FIGS. 7 to 9 illustrate an upper surface structure of a light absorbing layer of a decoration element.

FIGS. 10 to 14 are examples of a surface having a convex portion or concave portion shape of a pattern layer according to several embodiments.

FIG. 15 is a mimetic diagram illustrating an optical path depending on the lamination structure of a light absorbing layer and a light reflective layer.

FIGS. 16 and 17 show results of observing structures and colors of decoration members of Examples 5 to 7.

FIG. 18 presents n and k values of an aluminum oxynitride layer of Example 5.

FIGS. 19 and 20 are structures of pattern layers each used in Examples 8, 9 and Comparative Example 2.

FIG. 21 shows structures and colors of decoration members prepared in Examples 8 and 9 and Comparative Example 2.

FIGS. 22 and 23 illustrate a lamination structure of a decoration member comprising a color film.

FIG. 24 illustrates a structure of a pattern layer used in Example 10 to Example 28.

FIGS. 25 and 26 show properties of color films used in Example 10 to Example 28.

FIGS. 27 to 29 show colors of decoration members prepared in Example 10 to Example 28.

FIGS. 30 and 31 show experimental results according to Evaluation Example 2.

FIGS. 32 to 40 illustrate decoration members according to embodiments of the present specification.

FIG. 41 is a diagram presenting a method of distinguishing a light absorbing layer and a light reflective layer.

FIGS. 42 to 54 show experimental results according to Evaluation Example 3.

FIGS. 55 and 56 are diagrams introduced for describing a color coordinate system.

Three numbers shown in the colors of FIGS. 17, 21, 27 and 28 are L*ab coordinate values of the colors.

MODE FOR DISCLOSURE

Hereinafter, the present application will be specifically described with reference to examples, however, the scope of the present specification is not limited by the following examples.

Example 1

A hard mold was processed so as to have a pattern of a structure of FIG. 1. A pattern layer having a structure of FIG. 1 was formed by coating a composition comprising an epoxy resin and a phthalocyanine-based dye on a substrate layer, compressing the hard mold and then curing with ultraviolet rays. A decoration element was prepared by depositing aluminum to a thickness of 200 nm on the top of the pattern layer using a sputter method to form an inorganic material layer. A refractive index of the inorganic material layer for light having a wavelength of 400 nm was 5. In the prepared decoration element, both inclined angles of a first convex portion were each 20 degrees (a2) and 70 degrees (a3) and the width was 30 μm, and both inclined angles of a second convex portion were each 20 degrees (a5) and 70 degrees (a6) and the width was 5 μm. Heights (H1, H2) of the first and the second convex portions were each determined from the width and the inclined angle.

Example 2

A decoration element was prepared in the same manner as in Example 1 except that soft and hard molds were processed so as to have a pattern of a structure and of FIG. 2. In the prepared decoration element, both inclined angles of a convex portion were each 20 degrees and 70 degrees and the width was 30 μm, and both inclined angles of a concave portion were each 20 degrees (a8) and 70 degrees (a9) and the height (H3) was 3 μm. A height of the convex portion was determined from the width and the inclined angle, and a width of the concave portion was determined from the height and the inclined angle.

Example 3

A decoration element was prepared in the same manner as in Example 1 except that soft and hard molds were processed so as to have a pattern of a structure and of FIG. 3. In the prepared decoration element, both inclined angles of a first convex portion (P1) of a convex portion of a first area were each 20 degrees and 70 degrees and the width was 30 μm, and a convex portion (P4) of a second area had an inversed structure of 180 degrees with the convex portion of the first area, and both inclined angles were each 70 degrees and 20 degrees.

Example 4

A decoration element was prepared in the manner of FIG. 4 using a sputter method. A pattern layer was prepared in the same manner as in Example 1, and a first inorganic material layer (201) was formed by depositing molybdenum to a thickness of 100 nm by tilting toward a first inclined surface of the pattern layer, and then a second inorganic material layer (202) was formed by depositing aluminum to a thickness of 300 nm by tilting toward a second inclined surface.

Examples 5 to 7

After forming a pattern layer (FIG. 16) by coating an ultraviolet curable resin on a PET substrate layer, an $AlO_xN_y$ (0≤x, 0.1≤y≤1) light absorbing layer was formed on the pattern of the substrate using a reactive sputtering method by adding nitrogen. On the light absorbing layer, Al having a thickness of 100 nm was deposited using a sputtering method to form a light reflective layer (Al, thickness 120 nm).

The pattern layer shape was formed in a structure repeating an asymmetric prism structure as in FIG. 16, and a sample was prepared by employing an inclined angle on one side surface of the pattern as 60°, and an inclined angle on the other side as 40° (Example 5), 30° (Example 6) and 20° (Example 7). Herein, a pitch of the patterns was 100 micrometers, and a height of the pattern was 25 micrometers. Light entered to the substrate side of the obtained sample, passed through the light absorbing layer, and light reflected on the light reflective layer may be observed from the substrate side. The thickness and the color of the light absorbing layer observed from the obtained sample are presented in FIG. 17. n and k values of the aluminum oxynitride layer are described in FIG. 18.

Comparative Example 1

A decoration element was prepared in the same manner as in Example 5, except that the pattern layer shape was formed in a structure repeating symmetric prism structure, and an inclined angle on one side surface of the pattern was 45°, and an inclined angle on the other side was the same as 45°.

After forming a pattern (shape of FIG. 12) by coating an ultraviolet curable resin on a PET substrate layer, an $AlO_xN_y$ (0 x, 0.1=y=light absorbing layer was formed on the pattern of the substrate using a reactive sputtering method by adding nitrogen. On the light absorbing layer, Al having a thickness of 100 nm was deposited using a sputtering method to form a light reflective layer (Al, thickness 120 nm).

The pattern shape was formed in a structure repeating a symmetric prism structure, and an inclined angle on one side surface of the pattern was 45°, and an inclined angle on the other side was employed as 45°. Herein, a pitch of the patterns was 100 micrometers, and a height of the pattern was 25 micrometers. Light entered to the substrate side of the obtained sample, passed through the light absorbing layer, and light reflected on the light reflective layer may be observed from the substrate side.

Example 8

A decoration element was prepared in the same manner as in Examples 5 to 7, except that, by forming the pattern shape as in FIG. 19, the deposition thickness of the light absorbing layer on the left side inclined surface was 5.7 nm, and the deposition thickness of the light absorbing layer on the right side inclined surface was 3.7 nm, based on the vertex of the triangle of the cross-section of the light absorbing layer. An image of the color in a vertical direction on the inclined surface of the obtained sample is shown in FIG. 21.

Example 9

A decoration element was prepared in the same manner as in Example 8 except that, based on the vertex of the triangle of the cross-section of the light absorbing layer, the deposition thickness of the light absorbing layer on the left side inclined surface was 19.0 nm, and the deposition thickness of the light absorbing layer on the right side inclined surface was 12.2 nm. An image of the color in a vertical direction on the inclined surface of the obtained sample is shown in FIG. 21.

Comparative Example 2

A decoration element was prepared in the same manner as in Example 8 except that the pattern shape is formed to have a both side symmetrical inclined surface as in FIG. 20, and the deposition thickness of the light absorbing layer on the inclined surface of the light absorbing layer was uniform as 6.3 nm. An image of the color in a vertical direction on the inclined surface of the obtained sample is shown in FIG. 21.

Evaluation Example 1 Visual Evaluation of Dichroism

A visual evaluation of dichroism was performed for Examples 1 to 4 and Comparative Example 1 using a visual examination method. FIG. 5(a) and FIG. 5(b) are each an image of a right side view and a left side view of Example 1.

Evaluation Example 2 Visual Evaluation of Dichroism

FIG. 30 shows viewing angle-dependent color changes in the decoration element according to Example 1 and the decoration element according to Comparative Example 1.

It was identified that, whereas the decoration element according to Example 1 exhibited dichroism expressing different colors depending on a viewing angle, the decoration element according to Comparative Example 1 expressed just one color.

FIG. 31 measures and compares brightness values (L*), color values (*a) and saturation values (*b) of the decoration element according to Example 1 and the decoration element according to Comparative Example 1 in CIE L*a*b color space depending on a viewing angle.

In Example 1, it was identified that the brightness value (L*) and the saturation value (*b) significantly changed as the viewing angle changed.

Meanwhile, in Comparative Example 1, it was identified that the brightness value (L*) and the saturation value (*b) did not significantly change even when the viewing angle changed.

Examples 10 to 12

After forming a light reflective layer (Al, thickness 120 nm) by depositing Al on glass having a dichroism pattern as in FIG. 24 using a sputtering method, an AlON (Al 58 at %, O 3.5 at %, N 38.5 at %) light absorbing layer was formed thereon using a reactive sputtering method by adding nitrogen. On the light absorbing layer, a red color film was formed from a red pigment-dispersed solution using a wet coating process. Structures and properties for measuring properties of the red color film itself are shown in FIGS. 25 and 26.

The colors recognized through the air of the decoration members prepared in these Examples were calculated using reflectance (SCI, Specular Component Included) in a visible region measured using a CM-2600d device manufactured by Konica Minolta Inc. Specific conditions for the color conversion were based on a D65 light source and a 10° observer. The calculated results are shown in FIG. 27. Herein, the thickness of the side seen from the low angle of the light absorbing layer and the thickness of the side seen from the high angle was 30 nm and 10 nm, respectively, in Example 10, 80 nm and 30 nm, respectively, in Example 11, and 140 nm and 50 nm, respectively, in Example 12.

Examples 13 to 15

A decoration element was prepared in the same manner as in Examples 10 to 12 except that a blue color film was used instead of the red color film. Structures and properties for measuring properties of the blue color film itself are shown in FIGS. 25 and 26.

Results of calculating the colors recognized through the air of the decoration members prepared in these Examples as in Example 10 are shown in FIG. 27. Herein, the thickness of the side seen from the low angle of the light absorbing layer and the thickness of the side seen from the high angle was 30 nm and 10 nm, respectively, in Example 13, 80 nm and 30 nm, respectively, in Example 14, and 140 nm and 50 nm, respectively, in Example 15.

Examples 16 to 18

A decoration element was prepared in the same manner as in Examples 10 to 12 except that a gold color film was used instead of the red color film. Structures and properties for measuring properties of the gold color film itself are shown in FIGS. 25 and 26.

Results of calculating the colors recognized through the air of the decoration members prepared in these Examples as in Example 10 are shown in FIG. 27. Herein, the thickness of the side seen from the low angle of the light absorbing layer and the thickness of the side seen from the high angle was 30 nm and 10 nm, respectively, in Example 16, 80 nm and 30 nm, respectively, in Example 17, and 140 nm and 50 nm, respectively, in Example 18.

Examples 19 to 21

A decoration element was prepared in the same manner as in Examples 10 to 12 except that a red color film was formed on, instead of the light absorbing layer, the glass before forming the light absorbing layer from a red pigment-dispersed solution using a wet coating process.

Results of calculating the colors recognized through the glass of the decoration members prepared in these Examples as in Example 10 are shown in FIG. 28. Herein, the thickness of the side seen from the low angle of the light absorbing layer and the thickness of the side seen from the high angle was 30 nm and 10 nm, respectively, in Example 19, 80 nm and 30 nm, respectively, in Example 20, and 140 nm and 50 nm, respectively, in Example 21.

Examples 22 to 24

Results of calculating the colors recognized through the glass of the decoration members prepared in Examples 13 to 15 as in Example 10 are shown in FIG. 28. Herein, the thickness of the side seen from the low angle of the light absorbing layer and the thickness of the side seen from the high angle was 30 nm and 10 nm, respectively, in Example 22, 80 nm and 30 nm, respectively, in Example 23, and 140 nm and 50 nm, respectively, in Example 24.

Examples 25 to 27

Results of calculating the colors recognized through the glass of the decoration members prepared in Examples 16 to 18 as in Example 10 are shown in FIG. 28. Herein, the thickness of the side seen from the low angle of the light absorbing layer and the thickness of the side seen from the high angle was 30 nm and 10 nm, respectively, in Example 25, 80 nm and 30 nm, respectively, in Example 26, and 140 nm and 50 nm, respectively, in Example 27.

Example 28

After forming a blue color film as in Example 13 on glass having a dichroism pattern as in FIG. 24, an aluminum oxynitride layer was formed as a light absorbing layer using reactive sputtering deposition. The deposition process was carried out under a vacuum condition of a base pressure of $3 \times 10^{-6}$ and a process pressure of 3 mTorr, Ar gas was adjusted to 100 sccm, and reactive gas $N_2$ was adjusted to 14 sccm. On the light absorbing layer, an aluminum layer was deposited to a thickness of 100 nm as a light reflective layer. Results of comparing the colors observed through the glass for the decoration member prepared as above are shown in FIG. 29.

Examples 29 to 33

A hard mold was processed so as to have a pattern of a structure of FIG. 32. A pattern layer having a structure of FIG. 32 was formed by coating a composition comprising an acryl-based resin on a polyethylene terephthalate (PET) substrate layer, compressing the hard mold and then curing with ultraviolet rays. A decoration element was prepared by depositing aluminum to a thickness of 200 nm on the top of the pattern layer using a sputter method to form an inorganic material layer. In the decoration member of each Example, both inclined angles of a convex portion were each 20 degrees and 70 degrees (Example 29), 10 degrees and 70 degrees (Example 30), 20 degrees and 80 degrees (Example 31), 30 degrees and 70 degrees (Example 32) and 30 degrees and 60 degrees (Example 33), and the width was 30 μm. L*, a* and b* values depending on a viewing angle of each Example were measured and shown in FIG. 42 (Example 29), FIG. 43 (Example 30), FIG. 44 (Example 31), FIG. 45 (Example 32) and FIG. 46 (Example 33).

Examples 34 and 35

A hard mold was processed so as to have a pattern of a structure of each of FIGS. 33(*a*) and (*b*). The cross-section of the convex portion included a first inclined side and a second inclined side having different inclined angles, and the first inclined side included a straight-line shape, and the second inclined side included a curved-line shape. An inclined angle formed by the first inclined side and the ground was 70 degrees, and an angle formed by the segment and the ground when connecting a top point of the second inclined side and a point where the second inclined side adjoins the ground was 20 degrees. Details on the curved-line shape and the radius of curvature are the same as described above.

L*, a* and b* values depending on a viewing angle of each Example were measured and shown in FIG. 47 (Example 34) and FIG. 48 (Example 35).

Examples 36 and 37

A hard mold was processed so as to have patterns of structures of FIG. 34 and FIG. 36. The cross-section of the convex portion had a trapezoidal shape in which one pair of opposite sides is parallel and comprises a first inclined side and a second inclined side. When the ratios of L1:L2, m1:m2 and o1:o2 of FIG. 36 are all the same, the cross-section shape may be a trapezoid. Example 36 relates to a pattern layer prepared when the L1:L2 ratio was 1:1, and Example 37 relates to a pattern layer prepared when the L1:L2 ratio was 2:1. An inclined angle formed by the first inclined side and the ground was 20 degrees, and an angle formed by the second inclined side and the ground was 70 degrees. L*, a* and b* values depending on a viewing angle of each Example were measured and shown in FIG. 49 (Example 36) and FIG. 50 (Example 37).

Examples 38 and 39

A hard mold was processed so as to have patterns of structures of FIGS. 35(*a*) and (*b*). Example 38 exhibited the pattern shape of FIG. 35(*a*) and Example 39 exhibited the pattern shape of FIG. 35(*b*). In addition, the inclined angle c1 was 70 degrees, and c2 was 20 degrees. Details on D1 to D3 are the same as described above.

L*, a* and b* values depending on a viewing angle of each Example were measured and shown in FIG. 51 (Example 38) and FIG. 52 (Example 39).

Example 40

A hard mold was processed so as to have a pattern of a structure of FIG. 40. C1 was 20 degrees and c2 was 70 degrees. L*, a* and b* values depending on a viewing angle of Example 40 were measured and shown in FIG. 53.

Comparative Example 3

A decoration member was prepared in the same manner as in Example 29 except that both inclined angles of the convex portion were all the same as 45 degrees. L*, a* and b* values depending on a viewing angle of Comparative Example 3 were measured and shown in FIG. 54.

Evaluation Example 3 Evaluation of Color Ratio Between Prism Patterns

For the decoration members according to Examples 29 to 40 and Comparative Example 3, a viewing angle-dependent color ratio between prism patterns was evaluated, and the results are shown in FIGS. 42 to 54. Descriptions on the drawings for the evaluation results of each Example are the same as described above. For example, FIG. 54 shows L*, and b* values depending on a viewing angle of Comparative Example 3.

In Examples 29 to 40, it was identified that at least one value of L*, a*and b* rapidly changed with the changes in the viewing angle, however, in Comparative Example 3, L*, a and b values were constantly maintained or did not significantly change even when the viewing angle changed.

In Examples 29 to 40, a color difference (E*ab) was able to be significantly developed in the L*a*b* space by any one or more of the L*, a* and b* values significantly changing.

Meanwhile, in Comparative Example 3, even when the viewing angle changed, a color difference (E*ab) was not able to be significantly developed since a and b values were almost constantly maintained, or L* gently changed even when changing.

In each drawing, the color when looking at the decoration element in a viewing angle coordinate system is presented. The coordinate may be represented by ($\theta$, $\varphi$). When employing a direction perpendicular to a surface direction of the decoration element as an x axis, and any one direction of the surface direction of the decoration element as an y axis, an angle formed by the x axis and the viewing direction is referred to as $\theta$, and an angle formed by the y axis and the viewing direction is referred to as $\varphi$. When the $\varphi$ is 0 degrees ($\theta$, 0), L*, a* and b* values depending on the changes in the $\theta$ were measured. Details on the viewing angle coordinate system may be referred to a document IES type B Reference [IES-LM-75-01 Goniophotometer Types and Photometric Coordinates (title), IES(author), (Illuminating Engineering Society of North America, 2001)], and this is illustrated in FIG. 55.

In addition, the color of the decoration element is presented when $\theta$ and $\varphi$ both changed. FIG. 56 presents an angle of the viewing angle coordinate system.

REFERENCE NUMERAL

P1: Convex Portion or First Convex Portion P2: Second Convex Portion P3: Concave Portion, P4: Third Convex Portion 10: Pattern Layer 201: First Inorganic Material Layer 202: Second Inorganic Material Layer H1, H2, H3: Height W1, W2, W3: Width, S1, S2, S3, S4, S5, S6: Inclined Surface, a1, a4, a7: Vertex Angle, a2, a3, a5, a6, a8, a9: Inclined Angle C1: First Area C2: Second Area

The invention claimed is:
1. A decoration member comprising:
a pattern layer comprising a surface having a convex portion or concave portion shape having an asymmetric-structured cross-section; and
an inorganic material layer provided on the surface having the convex portion or concave portion shape,
wherein the convex portion or concave portion shape comprises a first inclined surface and a second inclined surface having different inclined angles,
wherein a difference in the inclined angles of the first inclined surface and the second inclined surface is in a range of 30 degrees to 70 degrees, and wherein the inorganic material layer provided on the first inclined surface has a different thickness than the inorganic material layer provided on the second inclined surface.

2. The decoration member of claim 1, wherein, in the convex portion or concave portion shape having an asymmetric-structured cross-section, at least one cross-section comprises two or more sides having different inclined angles, different curvatures, or different side shapes.

3. The decoration member of claim 1, wherein, in the convex portion or concave portion shape, at least one cross-section comprises a first inclined side and a second inclined side having different inclined angles.

4. The decoration member of claim 1, wherein the surface having the convex portion or concave portion shape comprises two or more of the convex portion or concave portion shapes.

5. The decoration member of claim 1, wherein borders of the asymmetric-structured cross-section are a straight line, a curved line or a combination thereof.

6. The decoration member of claim 1, wherein an angle formed by the first inclined surface and the second inclined surface is in a range of 80 degrees to 100 degrees.

7. The decoration element of claim 1, wherein the pattern layer has a flat portion on an opposite side surface of the surface forming the convex portion or concave portion.

8. The decoration element of claim 7, wherein the flat portion of the pattern layer is formed on a substrate layer.

9. The decoration element of claim 4, wherein a width of the convex portion or concave portion shape is from 10 μm to 90 μm, and a distance between the convex portions or concave portions is from 0 μm to 20 μm.

10. The decoration element of claim 1, wherein the pattern layer comprises a thermocurable resin or an ultraviolet curable resin.

11. The decoration element of claim 1, further comprising a color dye inside or on at least one surface of the pattern layer.

12. The decoration element of claim 1, wherein the inorganic material layer is a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites.

13. The decoration element of claim 1, wherein the surface of the pattern layer has a plurality of the convex portions, and a second convex portion having a smaller height compared to the convex portion between the adjacent convex portions.

14. The decoration element of claim 13, wherein the height of the second convex portion is in a range of 1/5 to 1/4 of the height of the convex portion.

15. The decoration element of claim 1, wherein the surface of the pattern layer has a shape in which a tip portion of the convex portion further comprises a concave portion having a smaller height compared to the convex portion.

16. The decoration element of claim 15, wherein the concave portion has a shape comprising two inclined surfaces having different inclined angles.

17. The decoration element of claim 1, wherein the inorganic material layer comprises a light absorbing layer and a light reflective layer consecutively provided on the pattern layer, or comprising a light reflective layer or a light absorbing layer consecutively provided on the pattern layer.

18. The decoration member of claim 1, further comprising a color film provided:
- between the pattern layer and the inorganic material layer;
- on a surface of the pattern layer opposite to the surface facing the inorganic material layer; or
- on a surface of the inorganic material layer opposite to the surface facing the pattern layer.

* * * * *